United States Patent
Oszinda et al.

(10) Patent No.: US 9,666,478 B2
(45) Date of Patent: May 30, 2017

(54) METHODS OF FORMING WIRING STRUCTURES AND METHODS OF MANUFACTURING SEMICONDUCTOR DEVICES

(71) Applicants: Thomas Oszinda, Hwaseong-si (KR); Tae-Jin Yim, Yongin-si (KR); Sang-Hoon Ahn, Goyang-si (KR); Nae-In Lee, Seoul (KR)

(72) Inventors: Thomas Oszinda, Hwaseong-si (KR); Tae-Jin Yim, Yongin-si (KR); Sang-Hoon Ahn, Goyang-si (KR); Nae-In Lee, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/048,993

(22) Filed: Feb. 19, 2016

(65) Prior Publication Data

US 2016/0329242 A1    Nov. 10, 2016

(30) Foreign Application Priority Data

May 8, 2015  (KR) .................. 10-2015-0064764

(51) Int. Cl.
  *H01L 21/76* (2006.01)
  *H01L 21/768* (2006.01)
(52) U.S. Cl.
  CPC .. *H01L 21/76831* (2013.01); *H01L 21/76825* (2013.01)

(58) Field of Classification Search
  CPC .................................. H01L 21/02203
  See application file for complete search history.

(56) References Cited

U.S. PATENT DOCUMENTS

| | | | |
|---|---|---|---|
| 6,558,755 B2 | 5/2003 | Berry, III et al. | |
| 6,806,161 B2 * | 10/2004 | Ko .................. | H01L 21/02126 257/E21.273 |
| 6,919,636 B1 | 7/2005 | Ryan | |
| 7,135,402 B2 | 11/2006 | Lin et al. | |
| 7,456,490 B2 | 11/2008 | Kloster et al. | |
| 7,838,428 B2 | 11/2010 | Chen et al. | |
| 7,981,699 B2 | 7/2011 | Sirard et al. | |
| 7,998,875 B2 | 8/2011 | DeYoung | |
| 8,039,049 B2 | 10/2011 | Lee et al. | |
| 8,481,423 B2 | 7/2013 | Arnold et al. | |

(Continued)

FOREIGN PATENT DOCUMENTS

| | | |
|---|---|---|
| JP | 2005503672 | 2/2005 |
| JP | 4913782 | 1/2012 |

(Continued)

*Primary Examiner* — Zandra Smith
*Assistant Examiner* — Andre' C Stevenson
(74) *Attorney, Agent, or Firm* — Renaissance IP Law Group LLP

(57) ABSTRACT

In a method of forming a wiring structure, an insulating interlayer is formed on a substrate. The insulating interlayer includes an opening and has pores distributed therein and exposed at a surface thereof. The insulating interlayer is exposed to a silane compound to form a pore sealing layer on the surface of the insulating interlayer and a sidewall of the opening. A conductive pattern filling the opening is formed on the pore sealing layer.

20 Claims, 24 Drawing Sheets

(56) References Cited

U.S. PATENT DOCUMENTS

| | | | |
|---|---|---|---|
| 2003/0216058 A1* | 11/2003 | Ko | ............ H01L 21/02126 |
| | | | 438/781 |
| 2004/0175957 A1 | 9/2004 | Lukas et al. | |
| 2011/0020955 A1 | 1/2011 | DeYoung | |
| 2012/0270339 A1 | 10/2012 | Xie et al. | |
| 2014/0045331 A1 | 2/2014 | Gordon et al. | |

FOREIGN PATENT DOCUMENTS

| | | |
|---|---|---|
| KR | 20120099220 | 9/2012 |
| KR | 20140010449 | 1/2014 |

\* cited by examiner

FIRST DIRECTION    SECOND DIRECTION

METHODS OF FORMING WIRING STRUCTURES AND METHODS OF MANUFACTURING SEMICONDUCTOR DEVICES

CROSS-REFERENCE TO RELATED APPLICATION

This application claims priority under 35 USC §119 to Korean Patent Application No. 10-2015-0064764, filed on May 8, 2015 in the Korean Intellectual Property Office (KIPO), the contents of which are incorporated by reference herein in their entirety.

BACKGROUND

1. Field

Example embodiments relate to wiring structures, methods of forming wiring structures and methods of manufacturing semiconductor devices. More particularly, example embodiments relate to wiring structures including a dielectric layer and a conductive pattern, methods of forming the same and methods of manufacturing semiconductor devices including the same.

2. Description of the Related Art

In a semiconductor device, a wiring structure for interconnection, such as a via structure or a contact, may be formed so that signal lines at different levels may be electrically connected to each other. For example, an opening through which a lower conductive pattern is exposed may be formed, and a metal may be deposited in the opening to form the wiring structure.

As a degree of integration of the semiconductor device increases, a width and a pitch of the opening or the conductive pattern may decrease. Thus, process reliability in etching and deposition processes may become degraded during the formation of the wiring structure.

SUMMARY

Example embodiments discussed herein can be implemented to provide wiring structures having improved electrical and structural reliability. Other example embodiments discussed herein provide methods of forming such wiring structures. Other example embodiments discussed herein provide methods for manufacturing semiconductor devices including such wiring structures.

According to some example embodiments, there is provided a method of forming a wiring structure. In the method, an insulating interlayer may be formed on a substrate. The insulating interlayer may include an opening and may have pores distributed therein and exposed at a surface thereof. A pore sealing layer may be formed on the surface of the insulating interlayer and a sidewall of the opening by exposing the insulating interlayer to a silane compound represented by the formula: (Re)a(Si)(R)b(Bu)c. In this formula, Re, R and Bu may represent a reactive group, an alkyl group and a sealing group, respectively, bonded to a silicon (Si) atom. Re may be ammonia ($-NH_2$), an amino group, a halogen, a hydroxyl group or an alkoxy group, R may be a $C_1$-$C_3$ alkyl group, Bu may be a $C_4$-$C_{10}$ branched alkyl group or a $C_4$-$C_{10}$ unsaturated alkyl group. Each of a, b and c may be 1 or 2, and a sum of a, b and c may be 4. A conductive pattern may be formed on the pore sealing layer and fill the opening.

According to some other example embodiments, there is provided a method of forming a wiring structure. In the method, a lower structure including a lower wiring may be formed on a substrate. An insulating interlayer having pores may be formed on the lower structure. The insulating interlayer may be etched to form an opening, through which the lower wiring is exposed. An intermediate layer capping pores which are exposed at a surface of the insulating interlayer and a sidewall of the opening may be formed by exposing the insulating interlayer to a silane compound represented by the formula: (Re)(Si)(R)$_2$(Bu). In the formula, Re, R and Bu may represent a reactive group, an alkyl group and a sealing group, respectively, bonded to a silicon (Si) atom. Re may be ammonia ($-NH_2$) or an amino group, R may be a $C_1$-$C_3$ alkyl group, and Bu may be a $C_4$-$C_{10}$ branched alkyl group or a $C_4$-$C_{10}$ unsaturated alkyl group. A conductive pattern may be formed on the intermediate layer and fill opening.

According to some example embodiments, there is provided a method of manufacturing a semiconductor device. In the method, a plurality of semiconductor fins may be formed on a substrate. A gate structure may be formed to extend on and cross the semiconductor fins. Source/drain regions may be formed at upper portions of the semiconductor fins adjacent to the gate structure. A contact may be formed to electrically connect to at least one of the source/drain regions. An insulating interlayer may be formed on the gate structure, the source/drain regions and the contact. The insulating interlayer may include an opening therein and an intermediate layer may be formed on a surface of the insulating interlayer and a sidewall of the opening by exposing the insulating interlayer to a silane compound represented by the formula: (Re)a(Si)(R)b(Bu)c. In the formula, Re, R and Bu may represent a reactive group, an alkyl group and a sealing group, respectively, bonded to a silicon (Si) atom. Re may be ammonia ($-NH_2$), an amino group, a halogen, a hydroxyl group or an alkoxy group. R may be a $C_1$-$C_3$ alkyl group, and Bu may be a $C_4$-$C_{10}$ branched alkyl group or a $C_4$-$C_{10}$ unsaturated alkyl group. Each of a, b and c may be 1 or 2, and a sum of a, b and c may be 4. A conductive pattern may be formed on the intermediate layer and fill the opening.

According to some example embodiments, there is provided a wiring structure. The wiring structure includes a lower wiring on a substrate and an insulation layer over the lower wiring. The insulation layer includes an opening, wherein the lower wiring is exposed at a bottom of the opening and pores are distributed within the insulation layer and exposed at a sidewall of the opening. The wiring structure also includes a conductive pattern filling the opening and electrically connected to the lower wiring. The wiring structure also includes a pore-sealing layer arranged on the sidewall of the opening, selectively with respect to the bottom of the opening, caps the pores exposed at the sidewall of the opening, and surrounds a sidewall of the conductive pattern. In some example embodiments, the pore sealing layer is formed from a reaction between the insulation layer and a silane compound represented by the formula: (Re)a(Si)(R)b(Bu)c. In the formula, Re, R and Bu may represent a reactive group, an alkyl group and a sealing group, respectively, bonded to a silicon (Si) atom. Re may be ammonia ($-NH_2$) or an amino group, R may be a $C_1$-$C_3$ alkyl group and Bu may be a $C_4$-$C_{10}$ branched alkyl group or a $C_4$-$C_{10}$ unsaturated alkyl group. Each of a, b and c may be 1 or 2, and a sum of a, b and c may be 4.

BRIEF DESCRIPTION OF THE DRAWINGS

Example embodiments will be more clearly understood from the following detailed description taken in conjunction with the accompanying drawings.

FIG. 1 is a cross-sectional view illustrating a wiring structure in accordance with example embodiments;

FIG. 2 is a partial enlarged view of a portion "A" indicated in FIG. 1;

FIGS. 3 to 12 are cross-sectional views illustrating a method of forming a wiring structure in accordance with example embodiments;

FIGS. 13 to 22 are cross-sectional views illustrating another method of forming a wiring structure in accordance with example embodiments; and FIGS. 23 to 34 are perspective views and cross-sectional views illustrating a method of manufacturing a semiconductor device in accordance with example embodiments.

DESCRIPTION OF THE EMBODIMENTS

Figure 1:
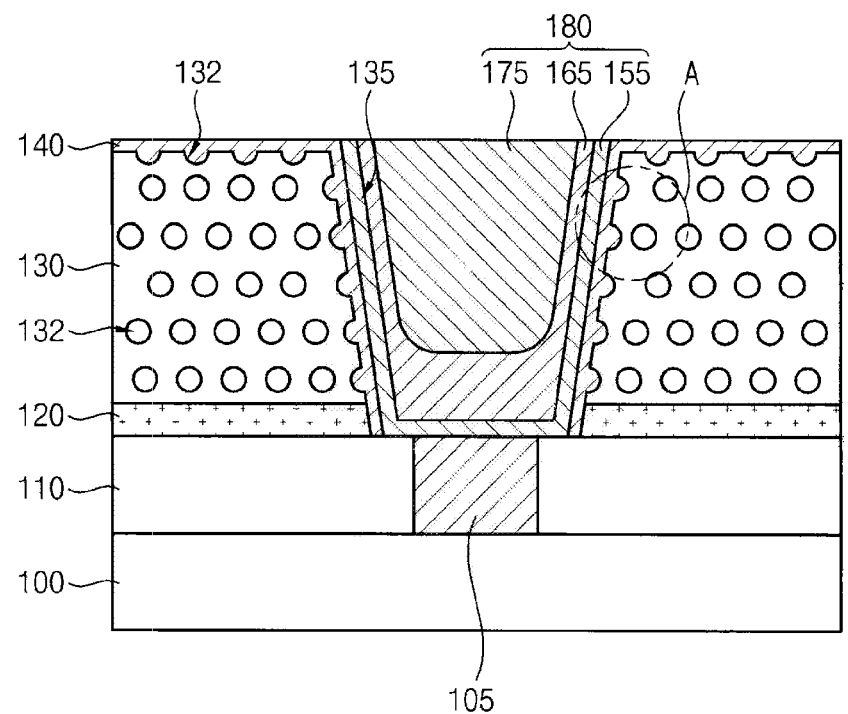
FIGS. 1 to 34 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although terms such as "first," "second," "third," "fourth," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
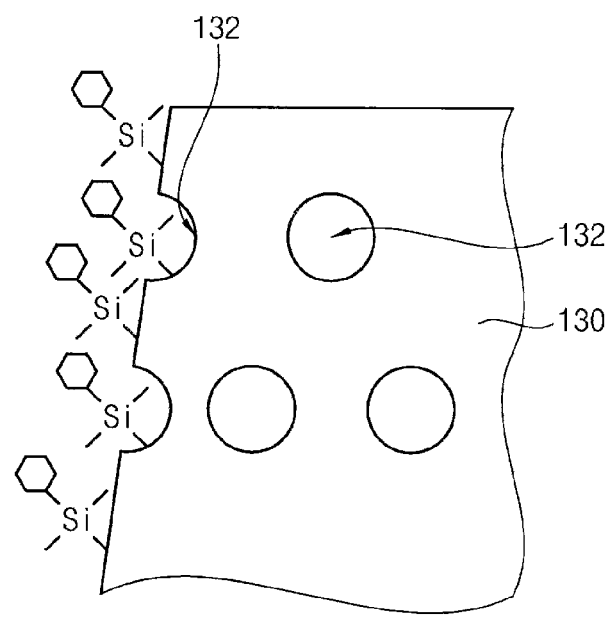

FIG. 1 is a cross-sectional view illustrating a wiring structure in accordance with example embodiments. FIG. 2 is a partial enlarged view of a portion "A" indicated in FIG. 1.

Referring to FIG. 1, the wiring structure may include a conductive pattern 180 formed in an opening 135 of an insulating interlayer 130, and a pore sealing layer 140 may be formed between sidewalls of the conductive pattern 180 and the opening 135. The conductive pattern 180 may include a barrier pattern 155, a seed pattern 165 and a metal pattern 175 sequentially stacked from the sidewall and a bottom of the opening 135.

The insulating interlayer 130 and the conductive pattern 180 may be disposed on a lower structure formed on a substrate 100. The lower structure may include a lower insulation layer 110 and a lower wiring 105.

In one embodiment, the substrate 100 may include a semiconductor substrate such as a silicon substrate, a germanium substrate a silicon-germanium substrate, or the like. In another embodiment, the substrate 100 may include a silicon-on-insulator (SOI) substrate, a germanium-on-insulator (GOI) substrate, or the like. In another embodiment, the substrate 100 may include a group III-V compound such as InP, GaP, GaAs, GaSb, or the like. The substrate 100 may include a p-type well or an n-type well therein. A circuit element such as a gate structure, an impurity region, a contact, a plug, etc., may be further formed on the substrate 100.

The lower insulation layer 110 may cover the circuit element on the substrate 100. The lower insulation layer 110 may include a silicon oxide-based material such as plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like or any combination thereof.

The lower wiring 105 may be disposed within the lower insulation layer 110, and may be electrically connected to the circuit element. The lower wiring 105 may include a conductive material such as a metal, a metal nitride, a metal silicide and/or doped polysilicon. In one embodiment, the lower wiring 105 may serve as, e.g., a pad or a contact.

An etch-stop layer 120 may be formed on the lower insulation layer 110 and the lower wiring 105. The etch-stop layer 120 may include, e.g., silicon nitride, silicon oxynitride, or the like.

The insulating interlayer 130 may be formed on the etch-stop layer 120, and the opening 135 may be formed in the insulating interlayer 130. In example embodiments, the opening 135 may extend through the insulating interlayer 130 and the etch-stop layer 120, and a top surface of the lower wiring 105 may be at least partially exposed through the opening 135.

In some embodiments, the opening 135 may have a single damascene-via hole shape. In some embodiments, the opening 135 may have a dual damascene-opening shape. When provided with a dual damascene-opening shape, the opening 135 may include a via hole exposing the lower wiring 105, and a trench (not shown) extending from an upper portion of the via hole. For example, the trench may have a width and/or a length greater than that of the via hole.

In some embodiments, the insulating interlayer 130 may have a low dielectric constant (low-k), and may include a silicon oxide-based material containing a hydrocarbon group such as an alkyl group. For example, the insulating interlayer 130 may include silicon oxide-based material such as TEOS, BTEOS, PTEOS, BPTEOS, or polysiloxane containing alkyl substitution groups. In some embodiments, the insulating interlayer 130 may include a silicon oxycarbide (SiOC)-based material.

In example embodiments, the insulating interlayer 130 may have a porous structure. For example, pores 132 may be distributed within the insulating interlayer 130, which can help to reduce the dielectric constant of the insulating interlayer 130.

Some of the pores 132 may be exposed at the sidewall of the opening 135 and a top surface of the insulating interlayer 130. In some embodiments, these exposed pores 132 may have a shape resembling that of a recess (e.g., a hemispherical recess), a crack, or the like, or any combination thereof.

In example embodiments, the pore sealing layer 140 may partially or completely fill the pores 132 exposed at the sidewall of the opening 135 and the top surface of the insulating interlayer 130. The pore sealing layer 140 may extend along the sidewall of the opening 135 and the top surface of the insulating interlayer 130. Accordingly, the pores 132 exposed at the sidewall of the opening 135 and the top surface of the insulating interlayer 130 may be capped or sealed. As will be discussed in greater detail below, the pore sealing layer 140 may be formed by reacting the insulating interlayer 130 with a silane compound.

Referring to FIG. 2, the silane compound may include a sealing group (indicated as a hexagon) and an alkyl group bonded to a silicon (Si) atom. The silane compound may further include a reactive group, which may react with a reactive site at a surface of the insulating interlayer 130. Accordingly, the sealing group may enter into the pores 132 exposed at the surface of the insulating interlayer 130 to form the pore sealing layer 140 and cap or seal the exposed pores 132.

In example embodiments, the polarity of the silane compound and/or the pore sealing layer 140 may be reduced by the presence of the alkyl group, so that a dielectric constant of a resulting insulation structure (e.g., including the insulating interlayer 130 and the pore sealing layer 140) may be kept relatively low. Example structures and types of the silane compound will be described in more detail below.

Referring back to FIG. 1, the barrier pattern 155 may be formed on the sidewall and the bottom of the opening 135. The barrier pattern 155 may be in contact with the pore sealing layer 140 and the portion of the top surface of the lower wiring 105 exposed through the opening 135. The pore sealing layer 140 may serve as an intermediate layer or a buffer layer interposed between the barrier pattern 155 and the insulating interlayer 130.

The barrier pattern 155 may include a metal nitride, e.g., titanium nitride, tantalum nitride, or the like. In one embodiment, the barrier pattern 155 may include a chemically stable metal such as ruthenium (Ru), cobalt (Co), or the like.

The seed pattern 165 may be formed on the barrier pattern 155, and may fill a lower portion of the opening 135. In one embodiment, the seed pattern 165 may include copper (Cu). The metal pattern 175 may be formed on the seed pattern 165 to fill a remaining portion of the opening 135. In one embodiment, the metal pattern 175 may include Cu grown from the seed pattern 165.

The conductive pattern 180 may be defined by the barrier pattern 155, the seed pattern 165 and the metal pattern 175, sequentially stacked from the sidewall and the bottom of the opening 135. The conductive pattern 180 may serve as an upper wiring of a semiconductor device which may be electrically connected to the lower wiring 105 through the opening 135. For example, the conductive pattern 180 may serve as an interconnection structure formed by a Back-End-Of-Line (BEOL) process in a semiconductor fabrication. A sidewall of the conductive pattern 180 may be surrounded by the pore sealing layer 140.

According to example embodiments described above, the pore sealing layer 140 may partially or completely fill the pores exposed on the surface of the insulating interlayer 130. As a result, metal constituents included in the barrier pattern 155 may be prevented from diffusing or otherwise infiltrating into the insulating interlayer 130 through the pores 132. Thus, desirable dielectric or insulation properties of the insulating interlayer 130 may be maintained. Further, the porous structure within the insulating interlayer 130 may remain to achieve a low-k property of the insulating interlayer 130, and the pores 132 exposed on the surface may be selectively sealed by the pore sealing layer 140 to maintain the desired dielectric or insulation properties of the insulating interlayer 130.

In one embodiment, the sealing group contained in the silane compound of the pore sealing layer 140 may have a size that is substantially the same as or similar to that of the pore 132, and the pores 132 exposed on the surface of the insulating interlayer 130 may be sealed or cured without omission by the pore sealing layer 140. Accordingly, the pore sealing layer 140 may have a substantially continuous and seamless profile (e.g., along the sidewall of the opening 135 and along the top surface of the insulating interlayer 130).

Figure 6:
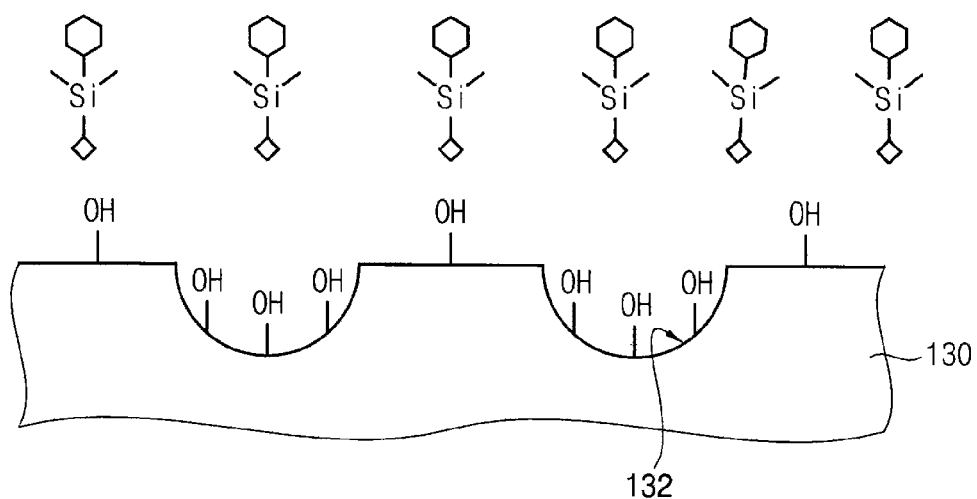
Figure 7:
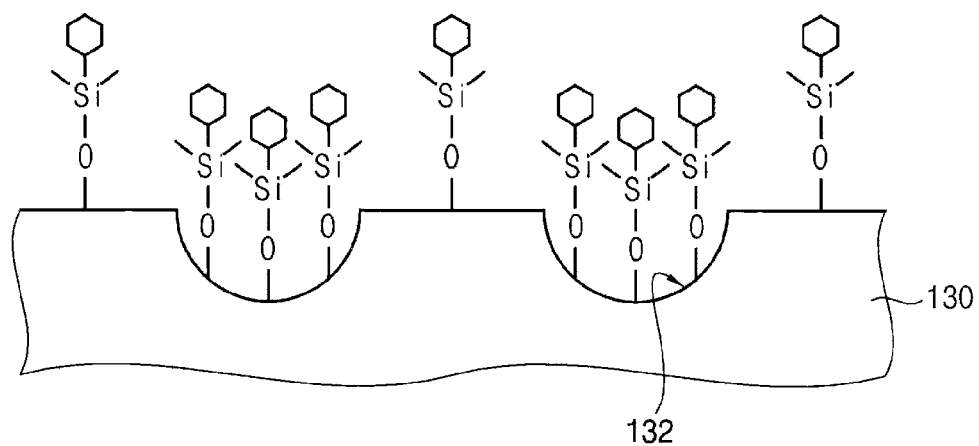
Figure 8:
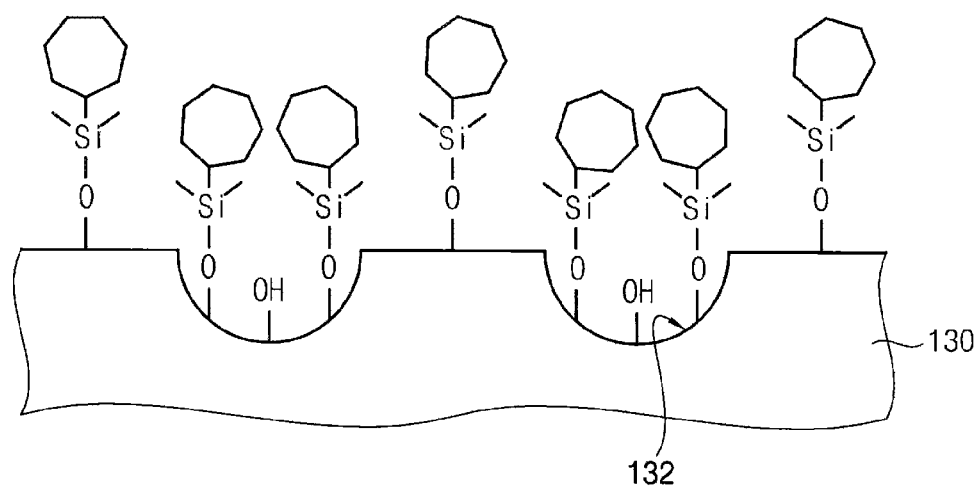

FIGS. 3 to 12 are cross-sectional views illustrating a method of forming a wiring structure in accordance with example embodiments. FIG. 8 is a cross-sectional view illustrating a formation of a pore sealing layer by a silane compound of a comparative example.

Figure 3:
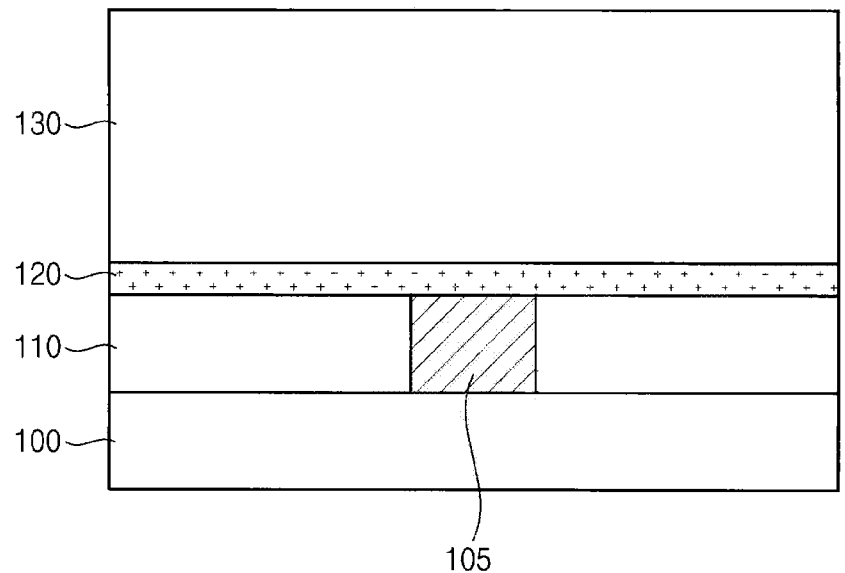

Referring to FIG. 3, a lower structure including a lower insulation layer 110 and a lower wiring 105 may be formed on a substrate 100.

A semiconductor substrate such as a silicon substrate, a germanium substrate a silicon-germanium substrate, an SDI substrate, a GOI substrate, etc., may be utilized as the substrate 100. In one embodiment, the substrate 100 may include a group III-V compound such as InP, GaP, GaAs, GaSb, or the like. P-type or n-type impurities may be doped in a portion of the substrate 100 to form a well (not illustrated). A circuit element (not illustrated) such as a gate structure, an impurity region, a contact, a plug, etc., may be further formed on the substrate 100.

The lower insulation layer 110 may be formed on the substrate 100 to cover the circuit element. For example, the lower insulation layer 110 may be formed of the silicon oxide-based material, as mentioned above.

In one embodiment, the lower insulation layer 110 may be formed by at least one process such as a chemical vapor deposition (CVD) process, a plasma enhanced chemical vapor Deposition (PECVD) process, a low pressure chemical vapor deposition (LPCVD) process, a high density plasma chemical Vapor Deposition (HDP-CVD) process, a spin coating process, a sputtering process, an atomic layer deposition (ALD) process, or the like.

After being formed, the lower insulation layer 110 may be partially etched to form a hole or a trench, and a conductive layer may be formed on the lower insulation layer by a deposition process, a plating process, etc., to partially or completely fill the hole or the trench. An upper portion of the conductive layer may be planarized by a chemical mechanical polish (CMP) process or an etch-back process to form the lower wiring 105. In one embodiment, the lower wiring 105 may be electrically connected to the circuit element formed on the substrate 100.

An etch-stop layer 120 and an insulating interlayer 130 may be sequentially formed on the lower insulation layer 110 and the lower wiring 105. In one embodiment, the etch-stop layer 120 may be formed of silicon nitride, silicon oxynitride, or the like. The insulating interlayer 130 may be formed of a low-k silicon oxide, a siloxane-based material, or the like. In one embodiment, the insulating interlayer 130 may be formed of a silicon oxide-based material such as TEOS, BTEOS, PTEOS, BPTEOS, or polysiloxane containing alkyl substitution groups, or the like or any combination thereof. In some embodiments, the insulating interlayer 130 may include a material such as silicon oxycarbide (SiOC).

The etch-stop layer 120 and the insulating interlayer 130 may be formed by a deposition process such as a CVD process, an ALD process, a PVD process, or the like. In some embodiments, the insulating interlayer 130 may be formed, during the deposition process, in the presence of a reactive gas provided with a porogen material. Accordingly, the insulating interlayer 130 may have a network structure in which oxygen atoms and carbon atoms are boned to silicon atoms.

Figure 4:
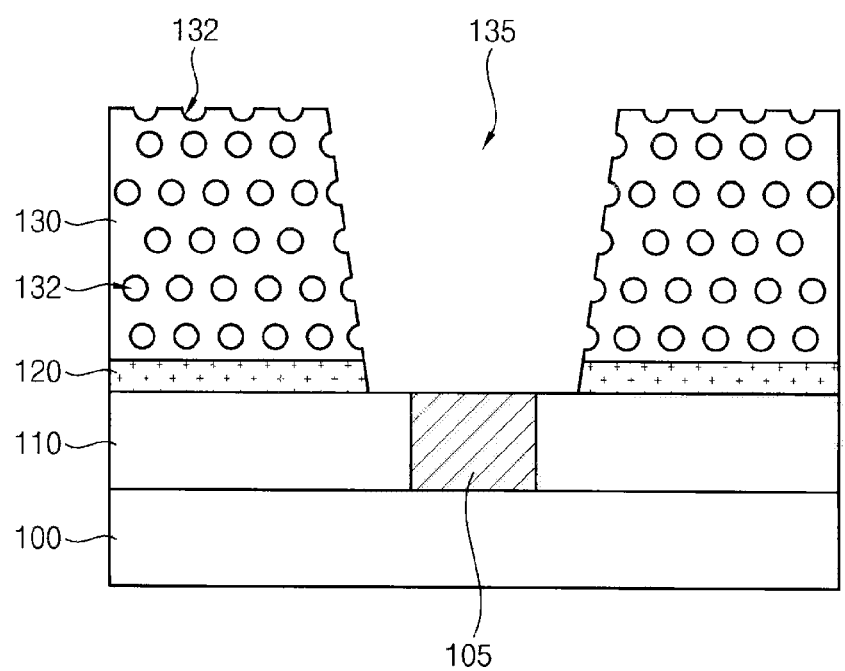

Referring to FIG. 4, the insulating interlayer 130 and the etch-stop layer 120 may be partially removed to form an opening 135. In one embodiment, the opening 135 may be formed by initially forming a photoresist layer on the insulating interlayer 130, and removing a portion of the photoresist layer (e.g., by exposure and developing processes) to form a photoresist pattern through which a top surface of the insulating interlayer 130 is partially exposed. Thereafter, the insulating interlayer 130 and the etch-stop layer 120 may be sequentially and partially etched using the photoresist pattern as a mask to form the opening 135. After the opening 135 is formed, the photoresist pattern may be removed by an ashing process and/or a strip process.

The opening 135 may be formed according to a single damascene process or a dual damascene process, and a sidewall of the opening 135 may have a continuous linear profile or a non-linear profile. A top surface of the lower wiring 105 may be at least partially exposed through the opening 135. In some embodiments, the top surface of the lower wiring 105 may be fully exposed through the opening 135, and a top surface of a portion of the lower insulation layer 110 around the lower wiring 105 may be also exposed through the opening 135.

In some embodiments, chemical bonds in the insulating interlayer 130 are damaged, e.g., during the etching process used to form the opening 135, the ashing process and/or the strip process used to remove the photoresist pattern, etc., so that pores 132 may be created in the insulating interlayer 130. For example, the bonds between silicon, oxygen and/or carbon atoms may be damaged by the above mentioned processes to create the pores 132.

In some embodiments, formation of the pores 132 may be facilitated by performing additional processes. For example, before and/or after forming the opening 135, the insulating interlayer 130 may be subjected to a modification treatment (e.g., including an ultraviolet (UV) irradiation, a plasma treatment, or the like). The porogen material combined or incorporated with the insulating interlayer 130 may be substantially removed during the modification treatment to create the pores 132 in the insulating interlayer 130. Therefore, the insulating interlayer 130 may have porous structure including a number of the pores 132.

As described above, the presence of the pores 132 within the insulating interlayer 130 can help to reduce the dielectric constant of the insulating interlayer 130. Some of the pores 132 may be exposed at a top surface of the insulating interlayer 130 and a sidewall of the opening 135. These exposed pores 132 may, in some embodiments, have a shape resembling that of a recess (e.g., a hemispherical recess), a crack, or the like, or any combination thereof. In some embodiments, hydroxyl (—OH) groups may be exposed at the top surface of the insulating interlayer 130 including the exposed pores 132, and at the sidewall of the opening 135. For example, the network structure between the silicon, oxygen and carbon atoms may be damaged so that the oxygen atoms may be exposed to the ambient atmosphere. As a result, these exposed oxygen atoms may be combined with hydrogen in the ambient atmosphere to create the hydroxyl groups exposed from a surface of the insulating interlayer 130.

Figure 5:
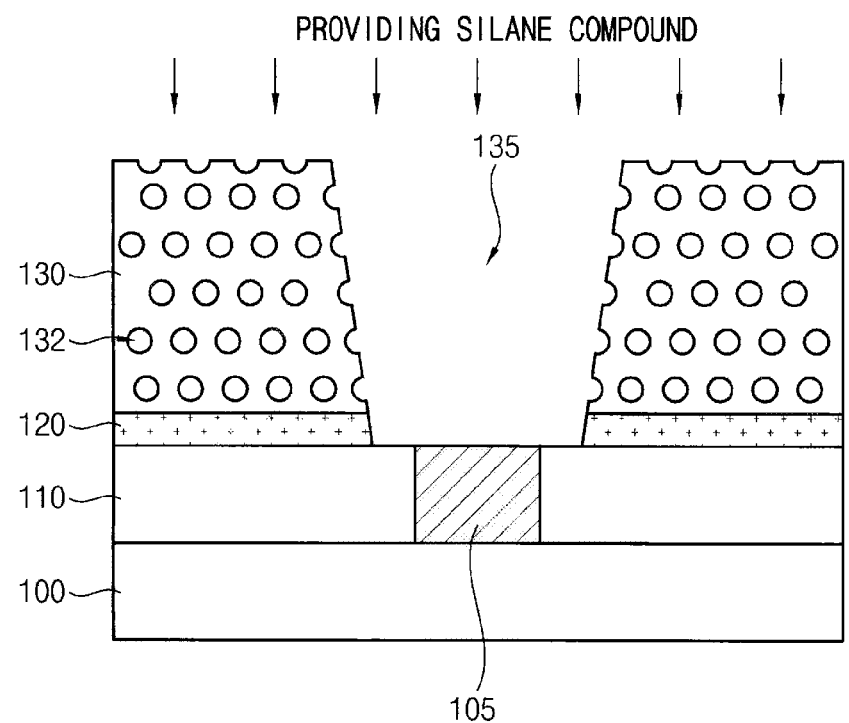

Referring to FIGS. 5 to 7, a silane compound may be provided to the top surface of the insulating interlayer 130 and the sidewall of the opening 135. In example embodiments, the silane compound may be represented by the following General Formula:

 (Re)$a$(Si)(R)$b$(Bu)$c$ [General Formula]

In the General Formula above, Re, R and Bu represent a reactive group, an alkyl group and a sealing group, respectively, each of which is bonded to a Si atom.

In example embodiments, Re may include ammonia (—NH$_2$), an amino group, a halogen, a hydroxyl group or an alkoxy group. R may include a C$_1$-C$_3$ alkyl group. Bu may include a C$_4$-C$_{10}$ branched alkyl group or a C$_4$-C$_{10}$ unsaturated alkyl group.

In some embodiments, each of a, b and c may be 1 or 2, and a sum of a, b and c may be 4. In one embodiment, a, b and c may be 1, 2 and 1, respectively. In some embodiments, when a is 2, the silane compound may contain a single species of reactive group (Re), or different species of reactive groups (Re). In some embodiments, when b is 2, the silane compound may contain a single species of the alkyl group (R), or different species of alkyl groups (R).

As illustrated in FIG. 6, pores 132 (e.g., having hemispherical shape) may be exposed on the surface of the insulating interlayer 130, and hydroxyl groups may be also exposed throughout the surface of the insulating interlayer 130. In FIG. 6, the reactive group (Re) of the silane compound is indicated as a rhombus, and the sealing group (Bu) is indicated as a hexagon.

As illustrated in FIG. 7, the reactive group (Re) may be reacted with the hydroxyl group so that the silane compound may be attached to the surface of the insulating interlayer 130. In this case, the hydroxyl group may serve as an adsorption site for the silane compound. For example, hydrogen included in the hydroxyl group may be combined with the reactive group (Re) of the silane compound to be removed so that a silyl ether (—Si—O—) bond may be created. Thus, the reactive group (Re) may substantially serve as a hydrogen acceptor (e.g., a base).

In some embodiments, the reaction between the hydroxyl group and the reactive group (Re) may be facilitated by providing an energy source such as UV irradiation, an infrared (IR) irradiation, a plasma treatment, or the like or any combination thereof, while the insulating interlayer 130 is exposed to the silane compound.

If the reactive group (Re) includes a halogen, a side reaction with the lower wiring 105 including a metal and exposed through the opening 135 may be caused. If the reactive group (Re) includes the hydroxyl group and the alkoxy group, the lower wiring 105 may be oxidized by oxygen constituents in the reactive group (Re). These oxygen constituents may be diffused or infiltrated into the insulating interlayer 130 to increase the polarity or permittivity of the insulating interlayer 130.

Thus, in some embodiments, the reactive group (Re) may be selected from ammonia or an amino group (e.g., to suppress side reactions and optimize a basic function as the hydrogen acceptor). Examples of the amino group may include dimethyl amino (—N(CH$_3$)$_2$), methyl ethyl amino (—N(CH$_3$)(CH$_2$CH$_3$)) or diethyl amino (—N(CH$_2$CH$_3$)$_2$). If an alkyl group combined with the amino group is greater than, e.g., a C$_3$ alkyl group, unreacted hydroxyl groups may remain on the surface of the insulating interlayer 130 due to a steric hindrance.

As the silane compound is combined or adsorbed on the surface of the insulating interlayer 130, the exposed pores 132 may be substantially sealed or capped by the sealing groups (Bu). The sealing group (Bu) may have a relatively bulky structure. In some embodiments, the sealing group (Bu) may have a size substantially the same as or similar to that of the exposed pore 132. Thus, the exposed pores 132 may be effectively capped by the sealing group (Bu).

In some embodiments, the sealing group (Bu) may include a C$_4$-C$_{10}$ branched alkyl group. For example, the sealing group (Bu) may include a tert-butyl group. If the sealing group (Bu) has a linear (e.g., non-branched) structure such as n-butyl or n-pentyl, sealing of the pores 132 may not be substantially implemented.

In a comparative example as illustrated in FIG. 8, if the size of the sealing group (Bu) (indicated as a heptagon) is too large, unreacted hydroxyl groups may remain in the exposed pores 132 due to a steric hindrance between the sealing groups (Bu) and increase the polarity or permittivity of the insulating interlayer 130. Accordingly, the size of the sealing group (Bu) may be selected to provide sufficient sealing of the exposed pores 132 while eliminating or otherwise reducing steric hindrance between the sealing groups. In an embodiment, the sealing group (Bu) may include a C$_4$-C$_6$ branched alkyl group.

In some embodiments, the sealing group (Bu) may include at least one C$_4$-C$_{10}$ unsaturated alkyl group. In an embodiment, the sealing group (Bu) may include at least one C$_4$-C$_6$ unsaturated alkyl group. In an embodiment, the sealing group (Bu) may include butenyl. If the sealing group (Bu) includes the C$_4$-C$_{10}$ unsaturated alkyl group, a polymerization reaction between neighboring sealing groups (Bu) of the silane compound may be beneficially induced. Accordingly, even though the sealing group (Bu) may not have a branched structure, the exposed pores 132 may be satisfactorily sealed or capped by a network of neighboring sealing groups (Bu) connected to each other.

The alkyl group (R) may serve as a buffer, lowering a polarity of the silane compound, thereby reducing the dielectric permittivity of the pore sealing layer 140 formed from the silane compound. Additionally, a polarity derived from the silyl ether bond may be buffered by the alkyl group (R).

The alkyl group (R) may be selected among the C$_1$-C$_3$ alkyl groups so that the reaction of the reactive group (Re) and capping of the sealing group (Bu) may not be hindered. In some embodiments, the alkyl group (R) may be selected from a methyl or an ethyl. In an embodiment, b is 2, and two methyl groups may be bonded to an Si atom as the alkyl groups (R).

Examples of the silane compound as described above may include compounds represented by the following Chemical Formulae. In the Chemical Formulae below, the reactive group is designated as Re, and a reference numeral and a name of each compound are also provided. As described above, Re may be selected from ammonia or the amino group. In some embodiments, the silane compound may include at least one compound selected from the group of compounds represented by Chemical Formulae (1) to (10).

[Chemical Formulae]

[Chemical Formulae]

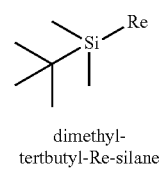

(1)

dimethyl-
tertbutyl-Re-silane

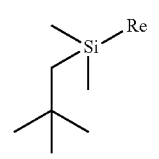

(2)

2-dimethylbutyl-
dimethyl-Re-silane (3)

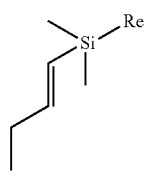

dimethyl-1-butene-Re-silane (4)

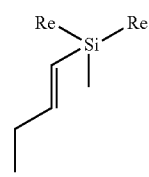

methyl-1-butene-bis(Re)-silane (5)

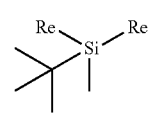

methyl-tertbutyl-bis(Re)-silane (6)

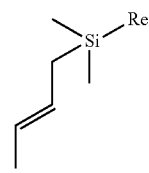

dimethyl-2-butene-Re-silane (7)

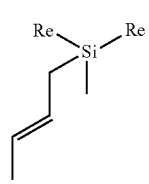

methyl-2-butene-bis(Re)-silane (8)

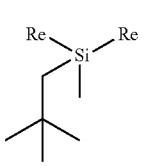

2-dimethylbutyl-methyl-bis(Re)-silane (9)

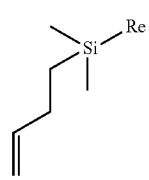

dimethyl-3-butene-Re-silane (10)

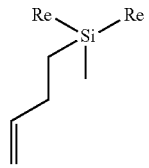

methyl-3-butene-bis(Re)-silane

Figure 9:
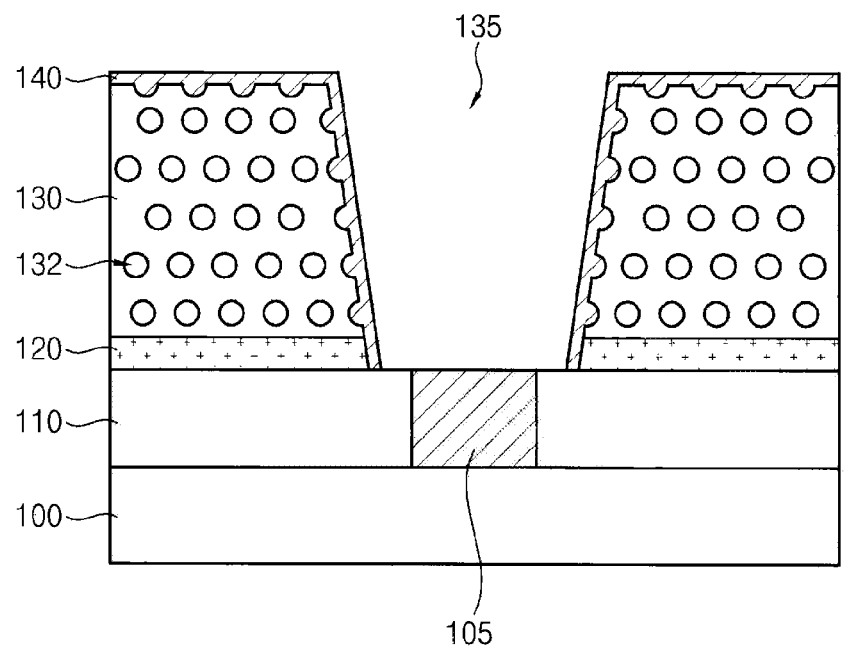

Referring to FIG. 9, the pore sealing layer 140 capping or sealing the pores 132 may be formed by the silane compound.

In example embodiments, the pore sealing layer 140 may partially or completely fill the pores 132 exposed by the opening 135, and may extend continuously (or at least substantially continuously) along the surface of the insulating interlayer 130. In some embodiments, the pore sealing layer 140 may not be formed at the bottom of the opening 135. Thus, oxidation or modification of the lower wiring 105 by the pore sealing layer 140 may be avoided.

Figure 10:
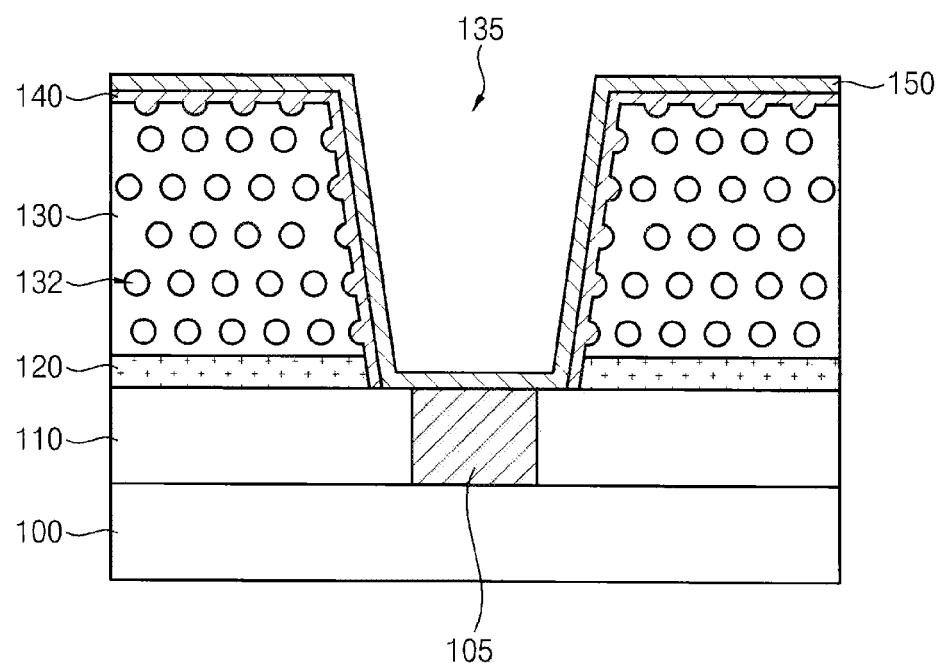

Referring to FIG. 10, a barrier layer 150 may be formed on a surface of the pore sealing layer 140 and at the bottom of the opening 135. The barrier layer 150 may contact the top surface of the lower wiring 105 exposed through the opening 135.

In example embodiments, the barrier layer 150 may be formed of a metal nitride such as titanium nitride, tantalum nitride, tungsten nitride, or the like or any combination thereof. The barrier layer 150 may prevent metal constituents in a subsequently-formed seed layer 160 from diffusing into the pore sealing layer 140 and/or the insulating interlayer 130. The barrier layer 150 may also function as an adhesion-promoting layer during formation of the seed layer 160. The barrier layer 150 may be formed by any suitable process, such as a sputtering process, a CVD process, an ALD process, or the like or any combination thereof. In some embodiments, the barrier layer 140 may be formed of a chemically stable metal such as Ru or Co by a CVD process.

Figure 11:
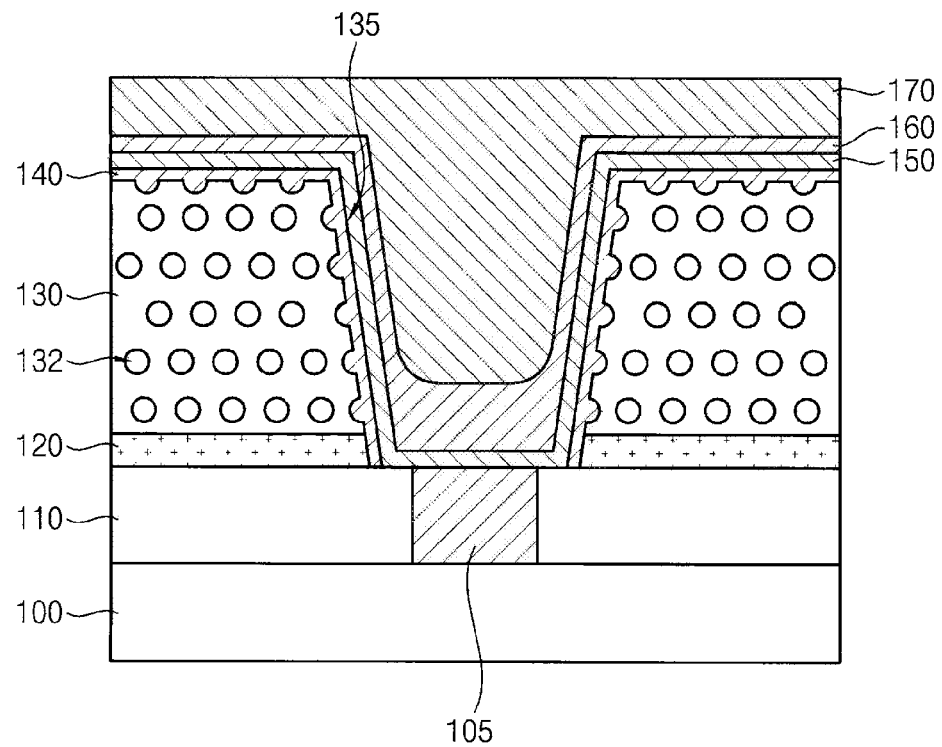

Referring to FIG. 11, the seed layer 160 may be formed on the barrier layer 140 to partially fill the opening 135, and a metal layer 170 may be formed on the seed layer 160 and fill the remainder of the opening 135.

In some embodiments, the seed layer 160 includes Cu, and is formed by a process such as a sputtering process, a reflow process, or the like or any combination thereof. As illustrated in FIG. 11, the seed layer 160 may be relatively thick at the bottom of the opening 135. Thus, the opening 135 may be sufficiently filled when the metal layer 170 is subsequently formed.

In some embodiments, the metal layer 170 includes Cu, and is formed by a process such as a plating process (e.g., an electroplating process), or the like. For example, the metal layer 170 may be formed by immersing the substrate 100, having the seed layer 160 formed thereon, in a plating solution including, e.g., copper sulfate, and then applying a current to the seed layer 160 and the plating solution, which respectively act as a cathode and an anode. Accordingly, the metal layer 170 including Cu may be precipitated or grown on the seed layer 160 through an electrochemical reaction.

Figure 12:
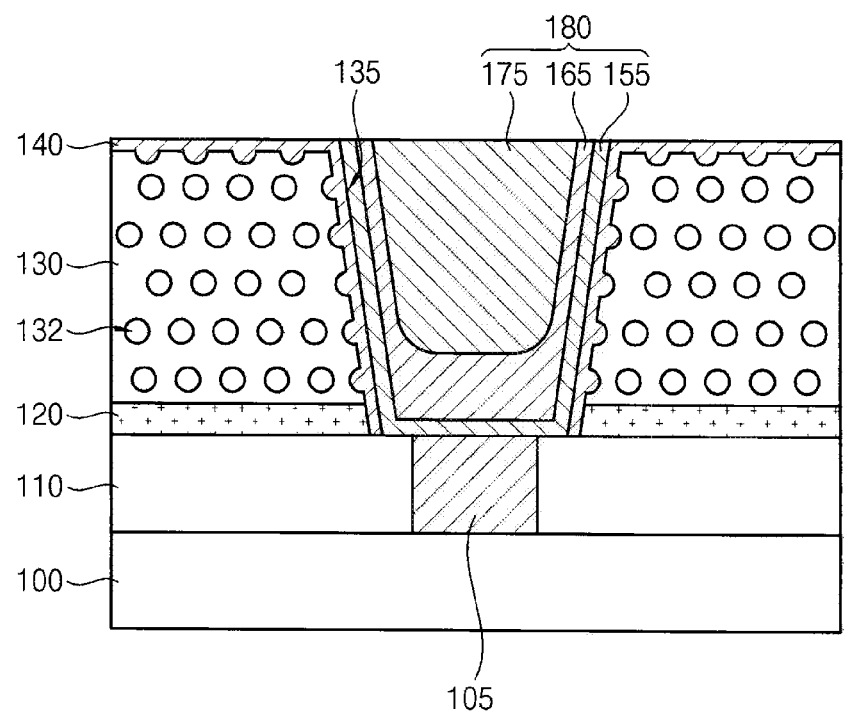

Referring to FIG. 12, upper portions of the metal layer 170, the seed layer 160 and the barrier layer 150 may be planarized by a process such as a CMP process and/or an etch-back process until the pore sealing layer 140 is exposed. Accordingly, a conductive pattern 180 electrically connected to the lower wiring 105 may be formed in the opening 135. In the illustrated example embodiment, the conductive pattern 180 may include a barrier pattern 155, a seed pattern 165 and a metal pattern 175 sequentially stacked from an inner wall of the opening 135.

According to example embodiments as described above, some of pores 132 in the insulating interlayer 130 (e.g., pores 132 exposed at the surface of the insulating interlayer 130) are capped by the pore sealing layer 140, to prevent metal constituents included in the barrier pattern 155 from diffusing into the insulating interlayer 130. Further, some of the pores 132 in the insulating interlayer 130 (e.g., pores 132 distributed within the interior of the insulating interlayer 130) remain unsealed by the pore sealing layer 140 to improve a low dielectric property of the insulating interlayer 130.

FIGS. 13 to 22 are cross-sectional views illustrating another method of forming a wiring structure in accordance with example embodiments. Detailed descriptions of processes and/or materials which are substantially the same as or similar to those discussed above with reference to FIGS. 3 to 12 are omitted herein.

Figure 13:
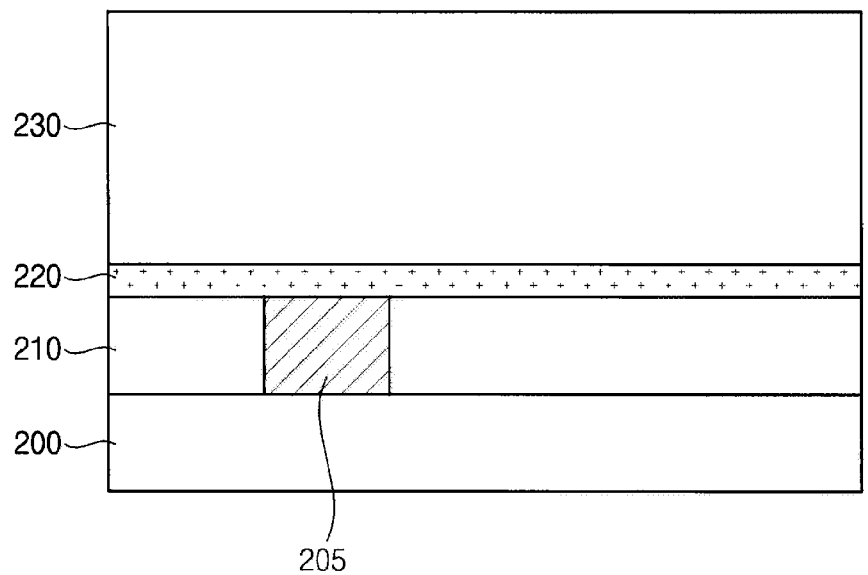

Referring to FIG. 13, a process substantially the same as or similar to that illustrated with reference to FIG. 3 may be performed to form a lower structure, which includes a lower insulation layer 210 and a lower wiring 205 be formed on a substrate 200, and to sequentially form an etch-stop layer 220 and insulating interlayer 230 on the lower structure.

Figure 14:
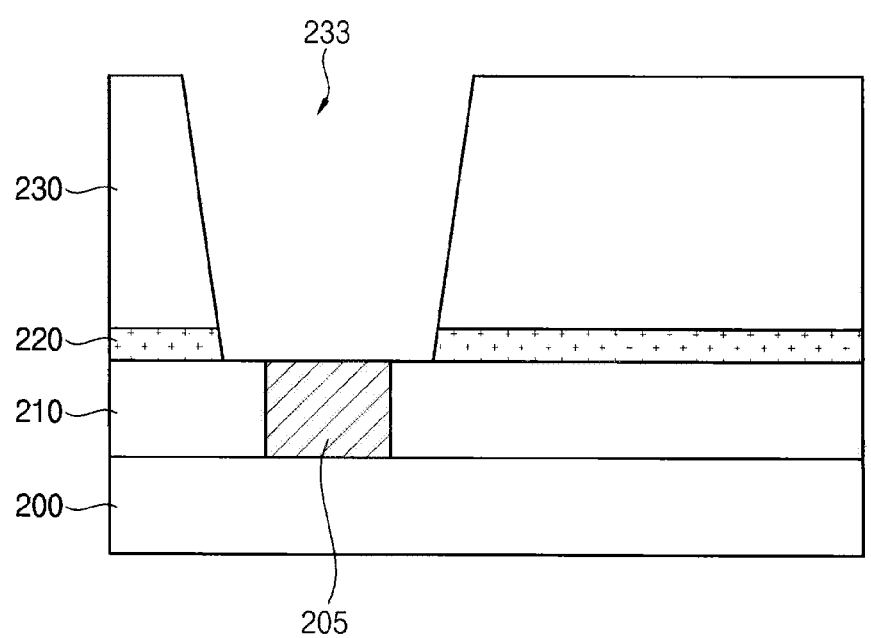

Referring to FIG. 14, a process substantially the same as or similar to that illustrated with reference to FIG. 4 may be performed to form a via hole 233 extending through the insulating interlayer 230 and the etch-stop layer 220. As shown, a top surface of the lower wiring 205 may be at least partially exposed through the via hole 233.

Figure 15:
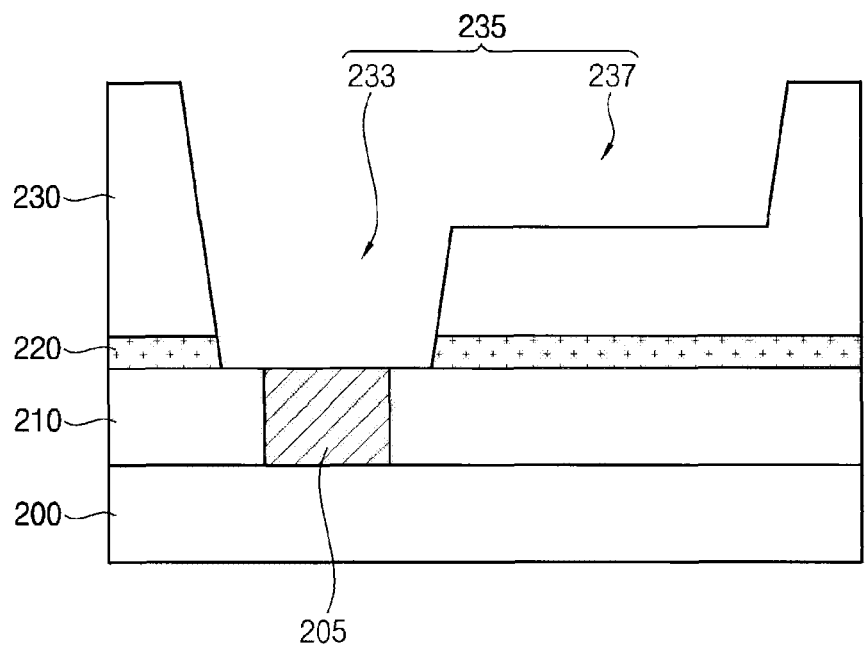

Referring to FIG. 15, an upper portion of the insulating interlayer 230 may be partially removed to form a trench 237 connected to the via hole 233. In one embodiment, the trench 237 may extend from an upper portion of the via hole 233 linearly, in one direction. Accordingly, an opening 235, which includes the via hole 233 and the trench 237, may be formed according to a dual damascene process.

Figure 16:
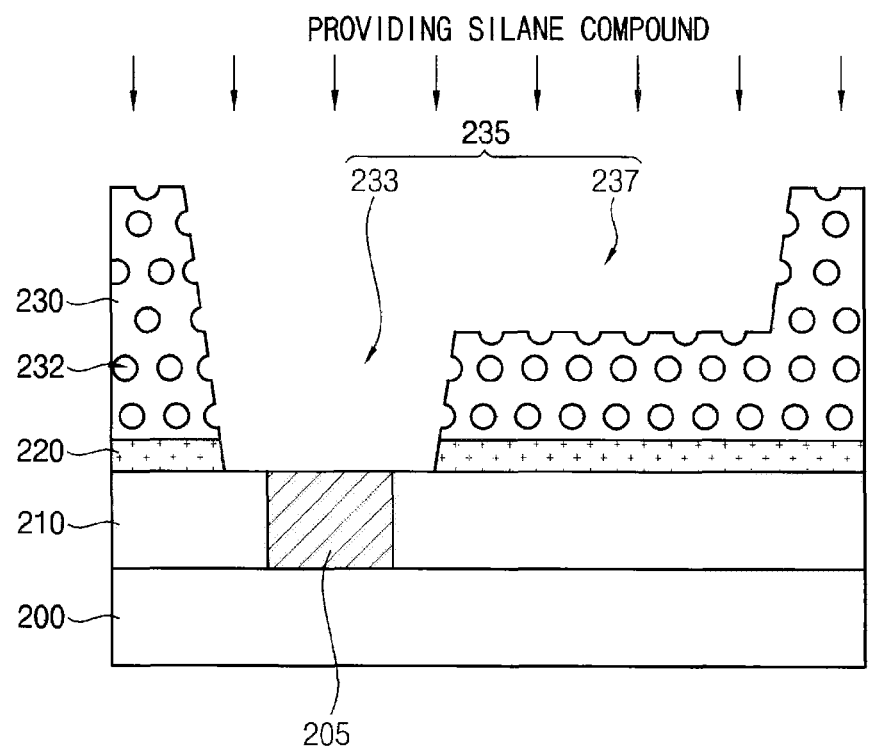

Referring to FIG. 16, processes substantially the same as or similar to those illustrated with reference to FIGS. 5 to 7 may be performed to create pores 232 within, and exposed at surfaces of, the insulating interlayer 230. Thus, although FIG. 16 illustrates the pores 232 as being formed after formation of the opening 235 (e.g., by a process such as the aforementioned modification treatment), it will be appreciated that the pores 232 may—additionally or alternatively—be formed by performing the modification treatment before formation of the via hole 233 and/or the trench 237, and/or be formed during formation of the via hole 233 and/or the trench 237 (e.g., before and/or during an etching, ashing and/or stripping process, as described above).

Figure 17:
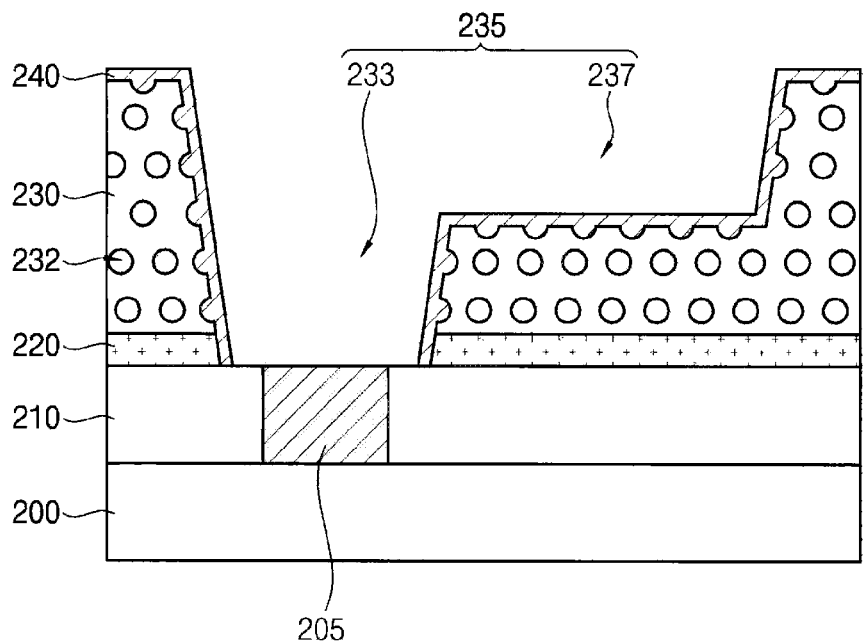

Referring to FIG. 17, a pore sealing layer 240, extending on the surface of the insulating interlayer 230 and sealing or capping the exposed pores 232, may be formed by exposing the insulating interlayer 220 to a silane compound as exemplarily described above with reference to FIGS. 5 to 7 and 9. In some embodiments, the silane compound may be provided on the surface of the insulating interlayer 230 and an inner wall of the opening 235. While providing the silane compound, the insulating interlayer 230 may be exposed to a UV irradiation, an IR irradiation, a plasma treatment, etc., to facilitate a reaction between a reactive group included in the silane compound and an adsorption site (e.g., a hydroxyl group) exposed on the surface of the insulating interlayer 230.

As described above, the silane compound may be represented by the following General Formula.

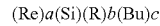

(Re)$a$(Si)(R)$b$(Bu)$c$          [General Formula]

In some embodiments, the reactive group (Re) may include ammonia, an amino group, or the like. Examples of the amino group may include dimethyl amino ($-N(CH_3)_2$), methyl ethyl amino ($-N(CH_3)(CH_2CH_3)$) or diethyl amino ($-N(CH_2CH_3)_2$). In some embodiments, the alkyl group (R) may include an ethyl, a methyl, or the like. In some embodiments, the sealing group (Bu) may include a $C_4$-$C_{10}$ branched alkyl group such as tert-butyl, a $C_4$-$C_{10}$ unsaturated alkyl group, or the like. In some embodiments, the sealing group (Bu) may include a $C_4$-$C_6$ branched or unsaturated alkyl group. In some embodiments, the silane compound may include at least one compound selected from the group of compounds represented by the aforementioned Chemical Formulae (1) to (10). Provided as discussed above, the silane compound may be utilized to ensure that the pore sealing layer 240 has a substantially seamless profile while suppressing remaining hydroxyl groups and a side reaction.

Figure 18:
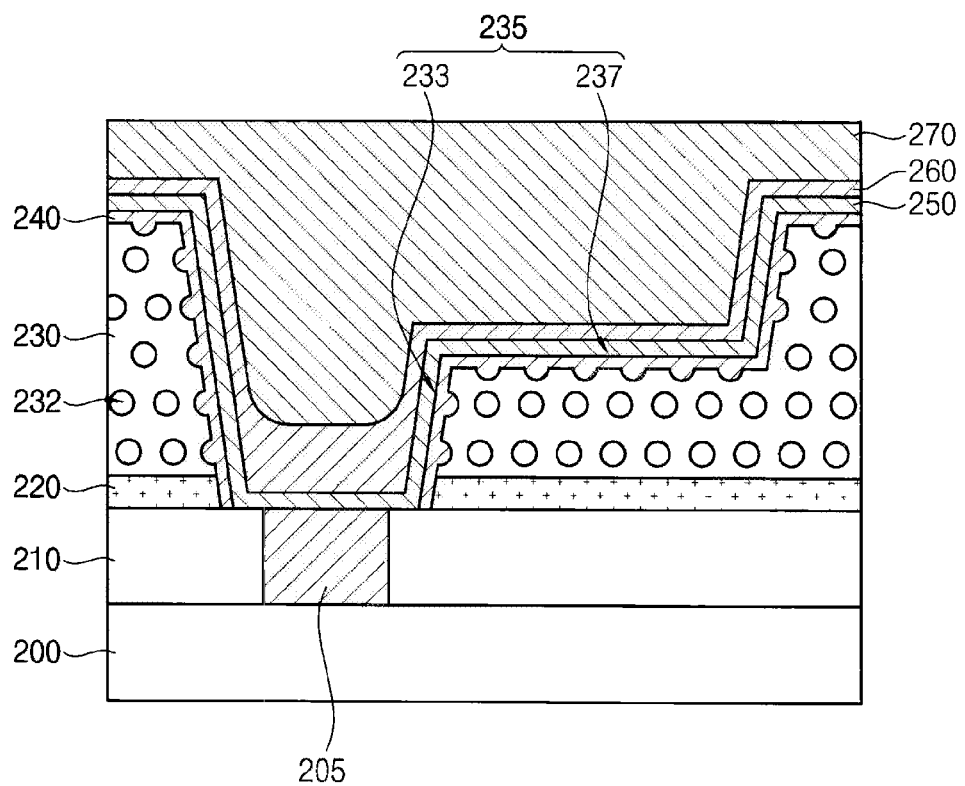
Figure 19:
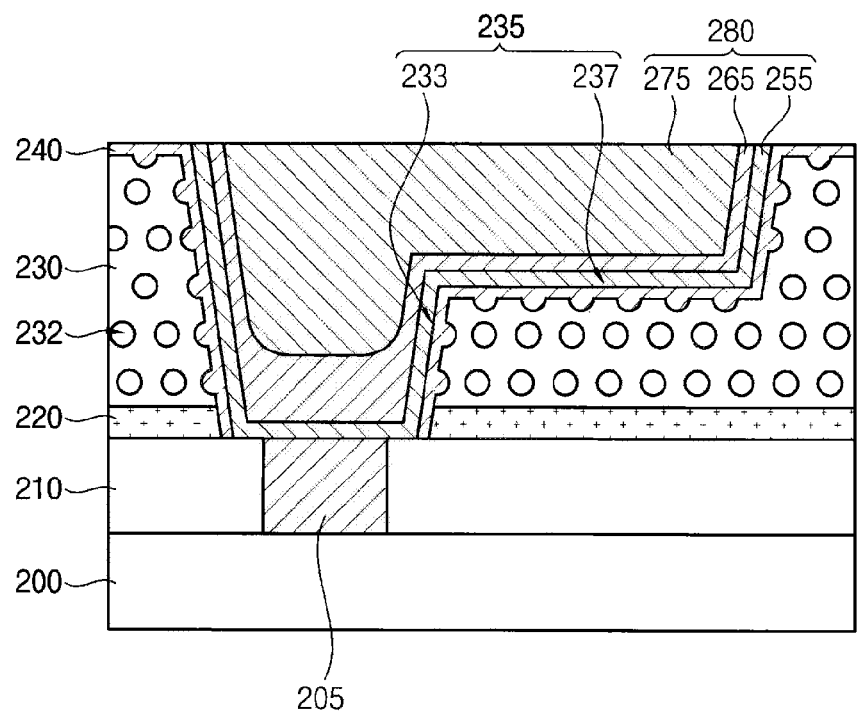

Referring to FIG. 18, processes substantially the same as or similar to those illustrated with reference to FIGS. 10 and 11 may be performed to form a barrier layer 250, a seed layer 260 and a metal layer 270 on the pore sealing layer 240 and within the opening 235. Referring to FIG. 19, a process substantially the same as or similar to that illustrated with reference to FIG. 12 may be performed to form a conductive pattern 280 (e.g., including a barrier pattern 255, a seed pattern 265 and a metal pattern 275 sequentially stacked on the inner wall of the opening 235).

In the illustrated embodiment, a portion of the conductive pattern 280 arranged in the via hole 233 and contacting the lower wiring 205 may be defined as a via portion, and a portion of the conductive pattern 280 arranged within the trench 237 may be defined as a wiring portion. Thus, the via portion and the trench portion of the conductive pattern 280 are integrally formed together. The pore sealing layer 240 may surround a sidewall of the via portion, and may also surround a sidewall and a bottom of the wiring portion.

In some example embodiments, one or more additional build-up processes may be further performed on the conductive pattern 280. For example, as illustrated in FIGS. 20 to 22, an upper conductive pattern 360 may be formed on the conductive pattern 280.

Figure 20:
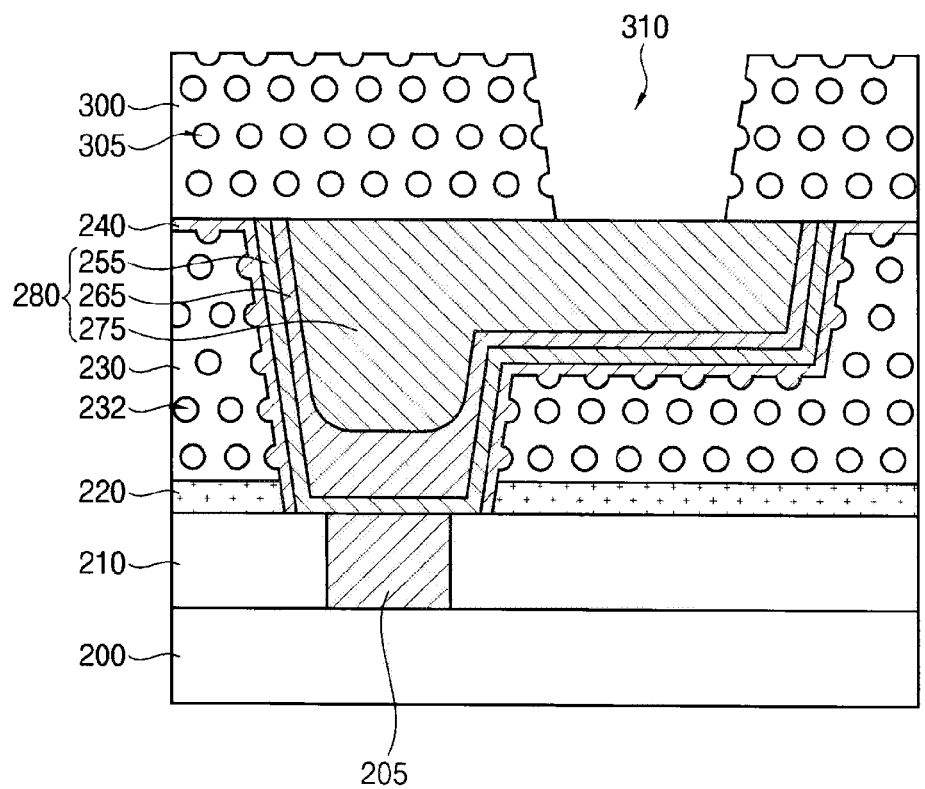

Referring to FIG. 20, an upper insulating interlayer 300 may be formed on the pore sealing layer 240 and the conductive pattern 280. The upper insulating interlayer 300 may be partially removed to form an upper opening 310 through which a top surface of, e.g., the wiring portion of the conductive pattern 280 may be exposed.

In example embodiments, pores 305 may be generated in the upper insulating interlayer 300 (e.g., as described above with respect to FIG. 4), and some of the pores 305 may be exposed at a top surface of the insulating interlayer 300 and a sidewall of the upper opening 310.

Figure 21:
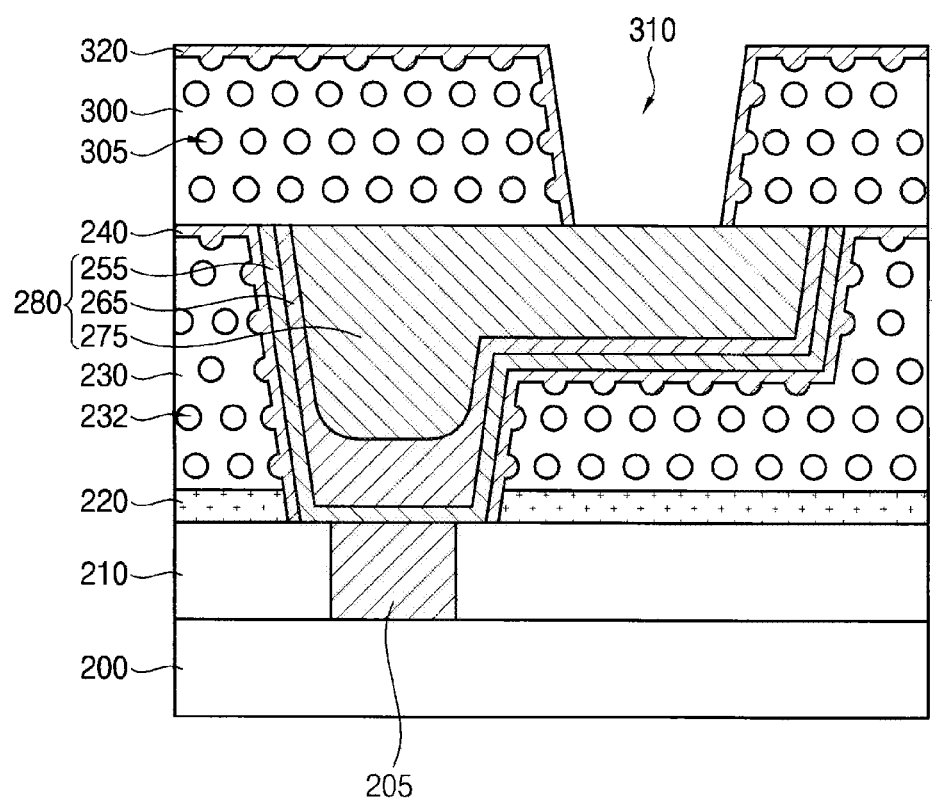
Figure 22:
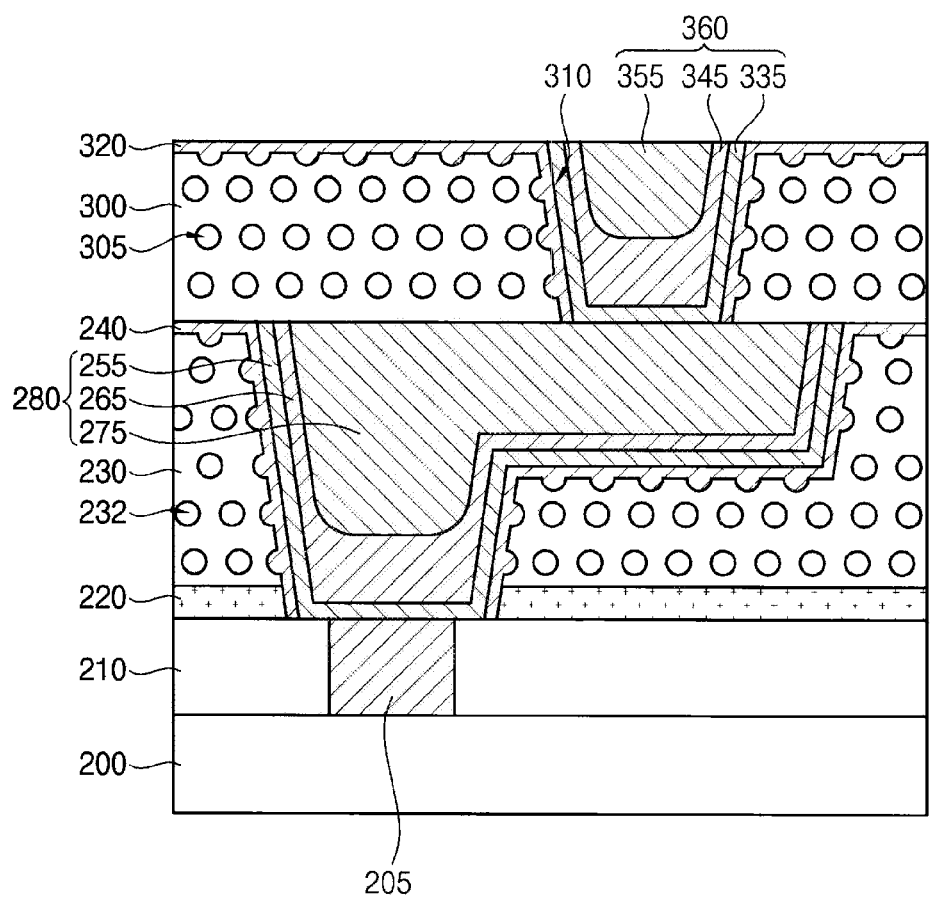

Referring to FIG. 21, processes substantially the same as or similar to those illustrated with reference to FIGS. 5 to 7 and FIG. 9 may be performed to form an upper pore sealing layer 320. As exemplarily illustrated, the upper pore sealing layer 320 may extend on the upper insulating interlayer 300 to cap or seal pores 305 which are exposed at a surface of the upper insulating interlayer 300.

Referring to FIG. 22, processes substantially the same as or similar to those illustrated with reference to FIGS. 10 to 12 may be performed to form an upper conductive pattern 360 (e.g., including an upper barrier pattern 335, an upper seed pattern 345 and an upper metal pattern 355) in the upper opening 310. As exemplarily illustrated, the upper pore sealing layer 320 may surround a sidewall of the upper conductive pattern 360.

FIGS. 23 to 34 are perspective views and cross-sectional views illustrating a method of manufacturing a semiconductor device (e.g., a fin field-effect transistor (FinFET)) in accordance with example embodiments. Specifically, FIGS. 23 to 26, 28 and 30 are perspective views illustrating the method and FIGS. 27, 29 and FIGS. 31 to 34 are cross-sectional views taken along line I-I' shown in FIGS. 26, 28 and 30. In FIGS. 23 to 34, two directions parallel to (or at least substantially parallel to) a top surface of a substrate and perpendicular to (or at least substantially perpendicular to) each other are referred to as a first direction and a second direction. The direction indicated by an arrow and a reverse direction thereof are considered as the same direction.

Figure 23:
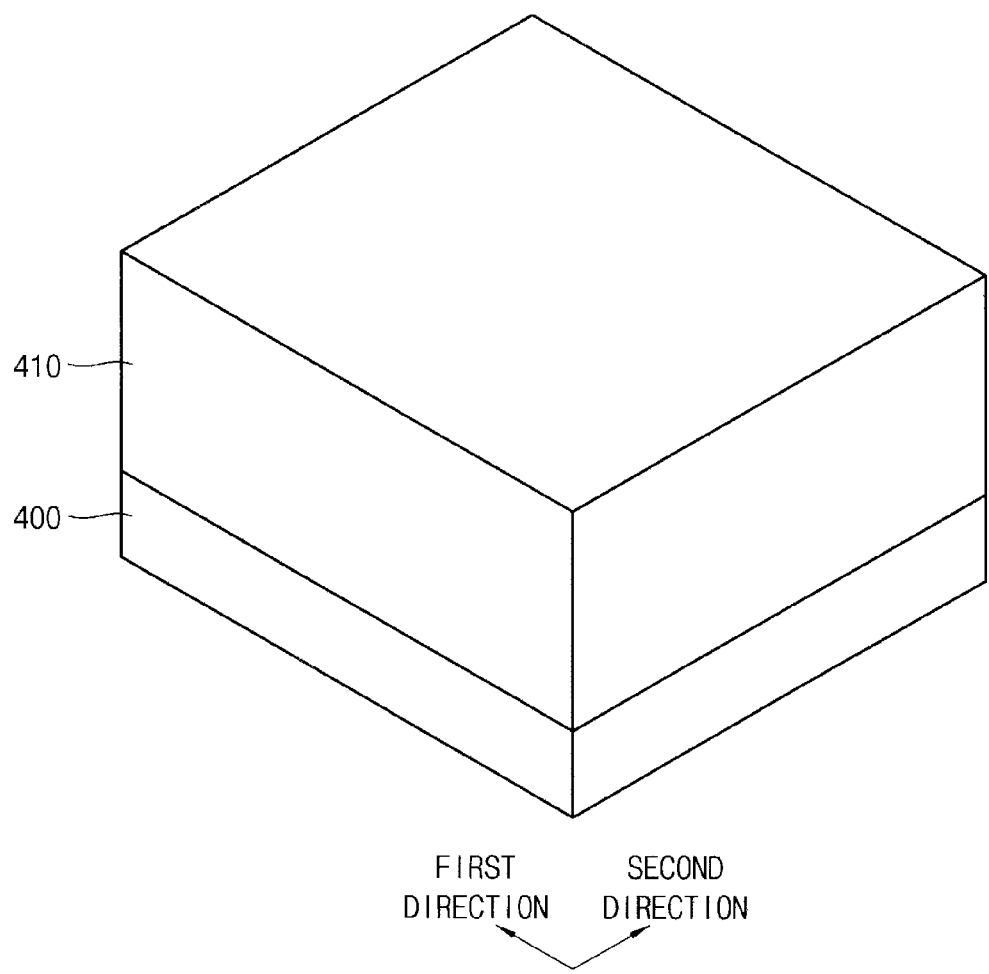

Referring to FIG. 23, a channel layer 410 may be formed on a substrate 400. The substrate 400 may include a semiconductor material such as Si. In some embodiments, the substrate 400 may be an SOI substrate, a GOI substrate, or the like. The channel layer 410 may include Si combined with a stress-generating constituent. In example embodiments, the channel layer 410 may include Si—Ge. In one embodiment, the channel layer 410 may be formed by a process such as a selective epitaxial growth (SEG) process, or the like. For example, the channel layer 410 may be formed by exposing the substrate 400 to a silicon source gas and a germanium source gas, where the top surface of the substrate 400 serves as a seed layer and the channel layer 410 (e.g., a Si—Ge layer) is grown on the seed layer. In this example, the Si source gas may include silane ($SiH_4$), dichlorosilane ($SiH_2Cl_2$), or the like, and the Ge source gas may include germane ($GeH_4$), germanium tetrachloride ($GeCl_4$), or the like.

Figure 24:
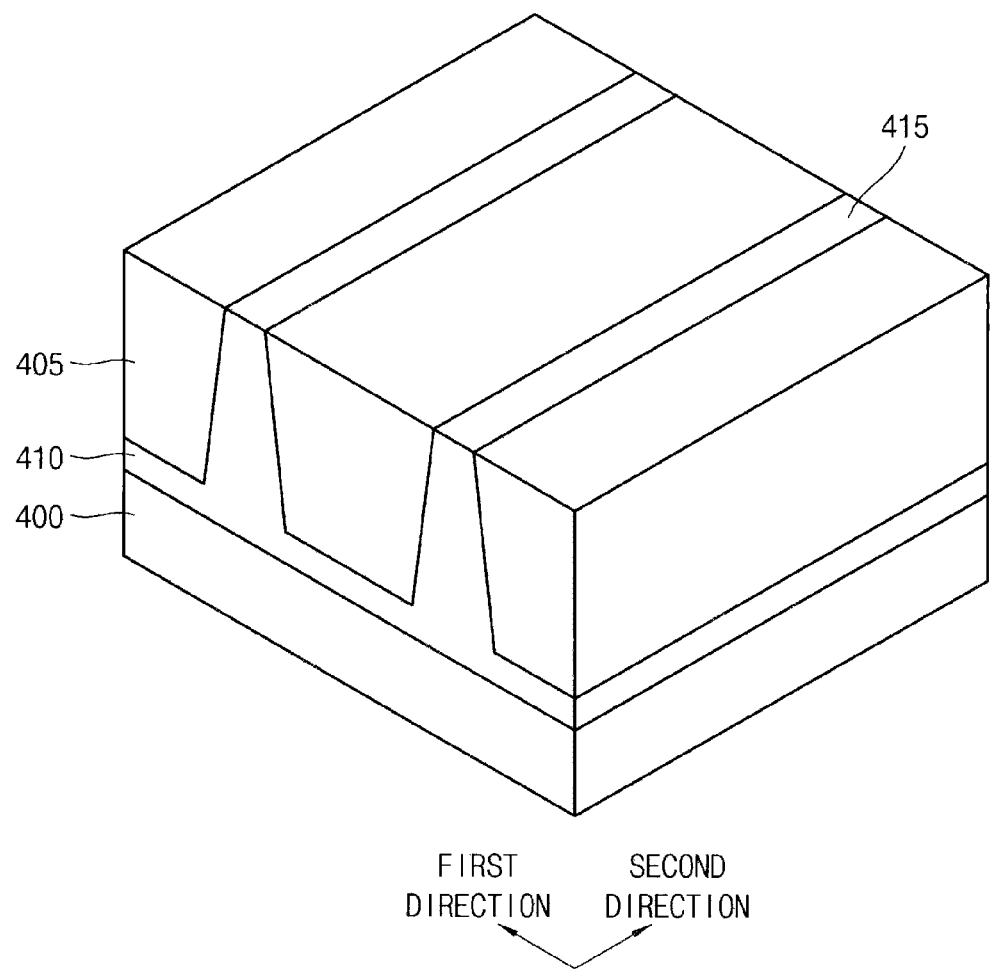

Referring to FIG. 24, an isolation layer 405 may be formed to define an active pattern 415. In one embodiment, the isolation layer 405 may be formed by a shallow trench isolation (STI) process. For example, the channel layer 410 may be partially removed to form an isolation trench, and then an insulation layer (e.g., formed of a material such as silicon oxide) may be formed on the channel layer 410 to sufficiently fill the isolation trench. Thereafter, the isolation layer 405 may be formed by planarizing an upper portion of the insulation, e.g., by a CMP process, until the channel layer 410 is exposed.

Upon forming the isolation trench, a plurality of protrusions are formed from the channel layer 410. The protrusions are defined by the isolation layer 405 and may herein be referred to as active patterns 415. As exemplarily shown, each active pattern 415 may extend linearly, e.g., in the second direction. In some embodiments, an ion-implantation process may be performed to form a well at an upper portion of the active patterns 415.

Figure 25:
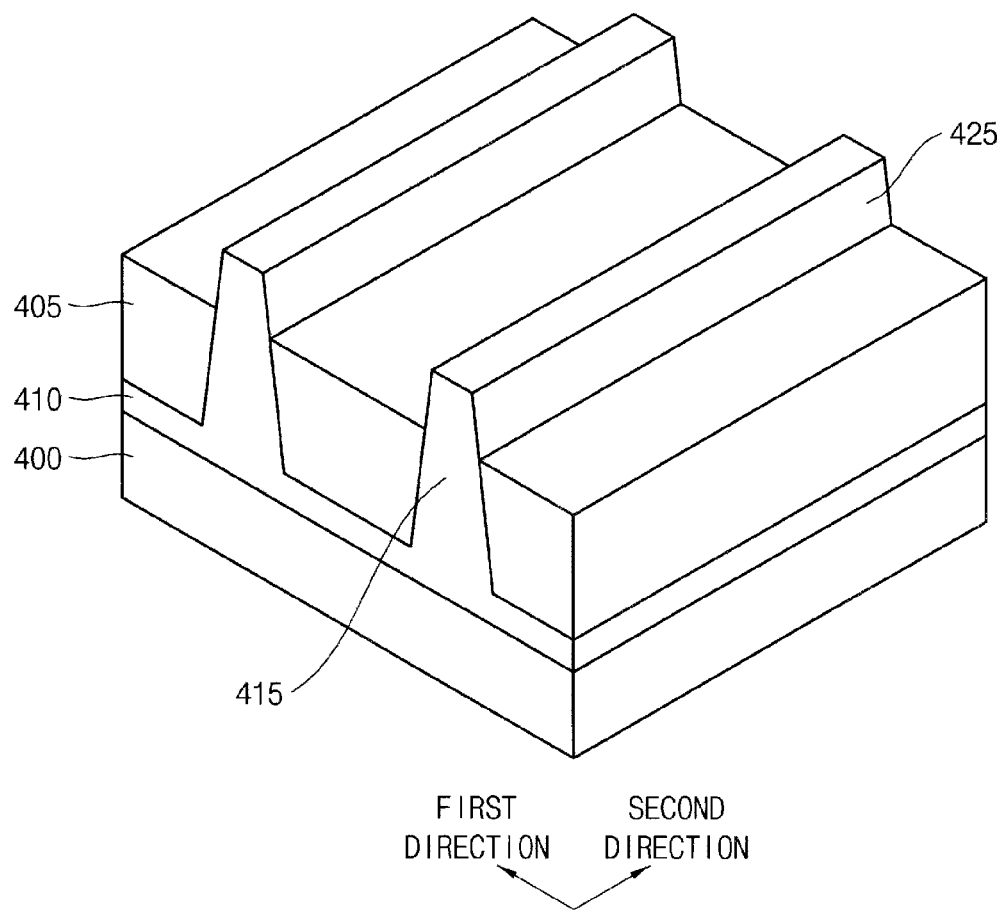

Referring to FIG. 25, an upper portion of the isolation layer 405 may be removed, e.g., by an etch-back process, to expose an upper portion of the active pattern 415, so that a top surface of the isolation layer 405 is recessed below a top surface of the active patterns 415. The exposed upper portion of each active pattern 415 may herein be referred to as a semiconductor fin 425. As exemplarily shown, each semiconductor fin 425 may extend in the second direction, and a plurality of the semiconductor fins 425 may be arranged along the first direction.

Figure 26:
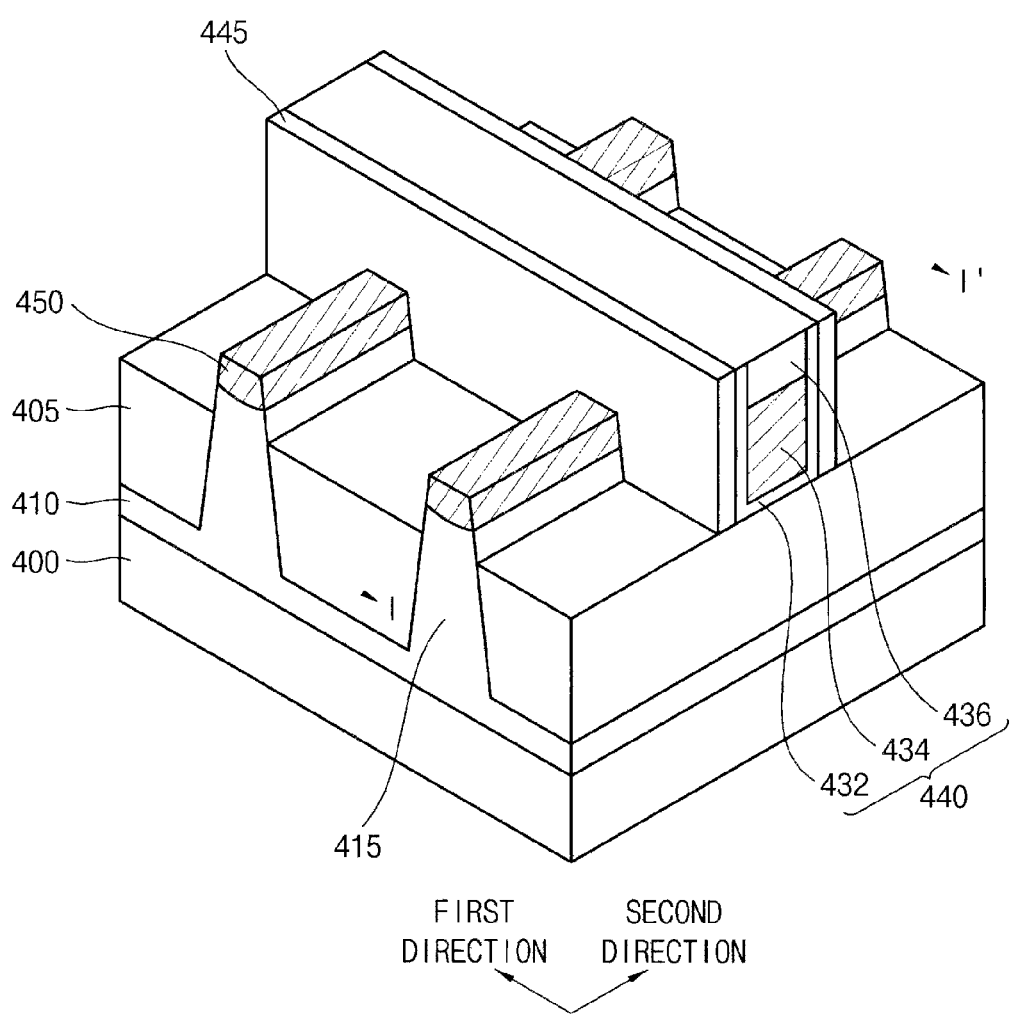
Figure 27:
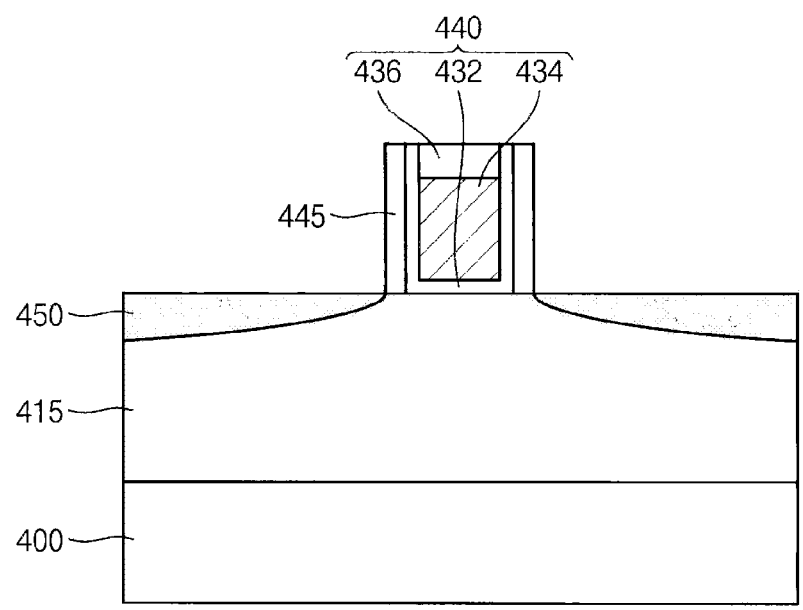
Figure 27:
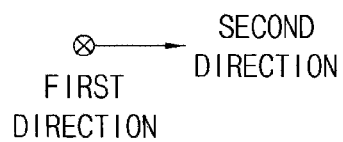

Referring to FIGS. 26 and 27, a gate structure 440 may be formed to extend in the first direction and cross the semiconductor fins 425. As exemplarily illustrated, the gate structure 440 may include a gate insulation layer 432, a gate electrode 434 and a gate mask 436, sequentially stacked on the isolation layer 405 and the semiconductor fins 425, and Gate spacers 445 may be formed on sidewalls of the gate structure 440. Although FIGS. 26 and 27 illustrate only one gate structure 440, it will be appreciated that a plurality of the gate structures 440 may be formed to extend in the first direction, and be arranged along the second direction.

In some example embodiments, the gate structure 440 may be formed by a damascene process. For example, a dummy pattern extending in the first direction and crossing the semiconductor fins 425 may be formed, and the gate spacers 445 may be formed on sidewalls of the dummy pattern. Thereafter, the dummy pattern may be removed to form an opening, and the gate insulation layer 432, the gate electrode 434 and the gate mask 436 may be sequentially formed in the opening to create the gate structure 440.

The gate insulation layer 432 may be formed of any suitable material such as silicon oxide, a metal oxide, or the like. The gate electrode 434 may be formed of a material such as a metal, a metal nitride, doped polysilicon and/or a metal silicide. The gate mask 436 and the gate spacer 445 may be formed of a material such as silicon nitride. The gate insulation layer 432, the gate electrode 434 and the gate mask 436 may be formed by any suitable process such as a CVD process, a PVD process, an ALD process, or the like or any combination thereof. In some embodiments, the gate insulation layer 432 may be formed by a thermal oxidation process on a top surface of the semiconductor fin 425.

An ion-implatation process may be performed using the gate structure 440 as an implantation mask to form a first source/drain region 450 at an upper portion of the semiconductor fin 425. The first source/drain region 450 may serve as, e.g., a lightly doped drain (LDD) region. A FinFET may thus be characterized as including the active pattern 425, the gate structure 440 and the first source/drain region 450.

Figure 28:
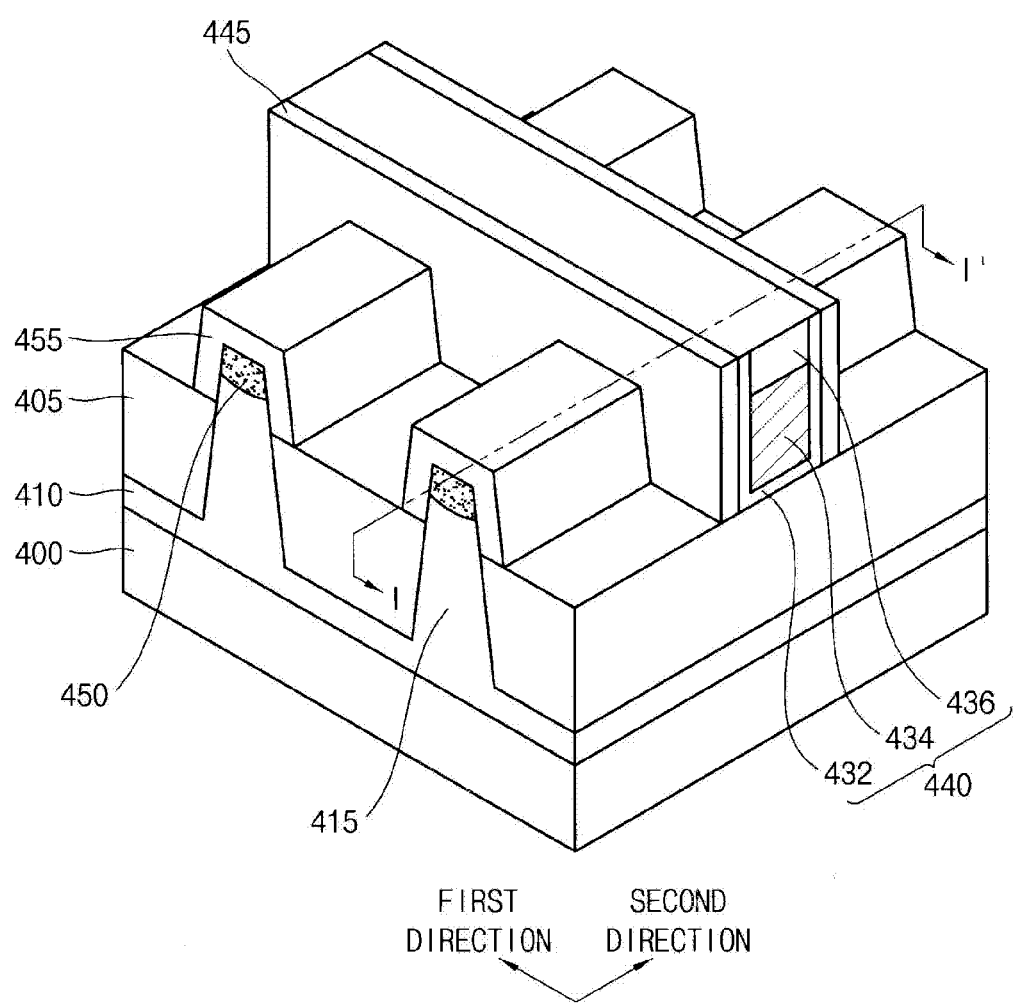
Figure 29:
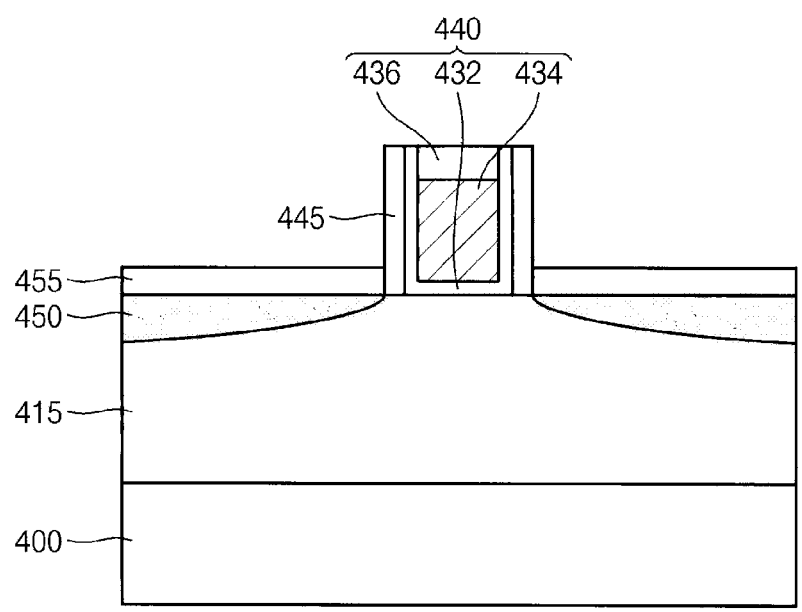
Figure 29:

Referring to FIGS. 28 and 29, a second source/drain region 455 may be formed on the semiconductor fin 425 and the first source/drain region 450. For example, an SEG process, in which the semiconductor fin 425 and/or the first source/drain region 450 may be used as a seed layer and a Si source gas such as dichlorosilane may be used as a reactive gas, may be performed to form an elevated source-drain (ESD) layer. Thereafter, impurities may be implanted into the ESD layer by an ion-implantation process to form the second source/drain region 455.

In some embodiments a Ge source gas or a hydrocarbon gas may be further provided together with the Si source gas while performing the SEG process to induce a stress within the second source/drain region 455, which can facilitate an operation in the FinFET.

Figure 30:
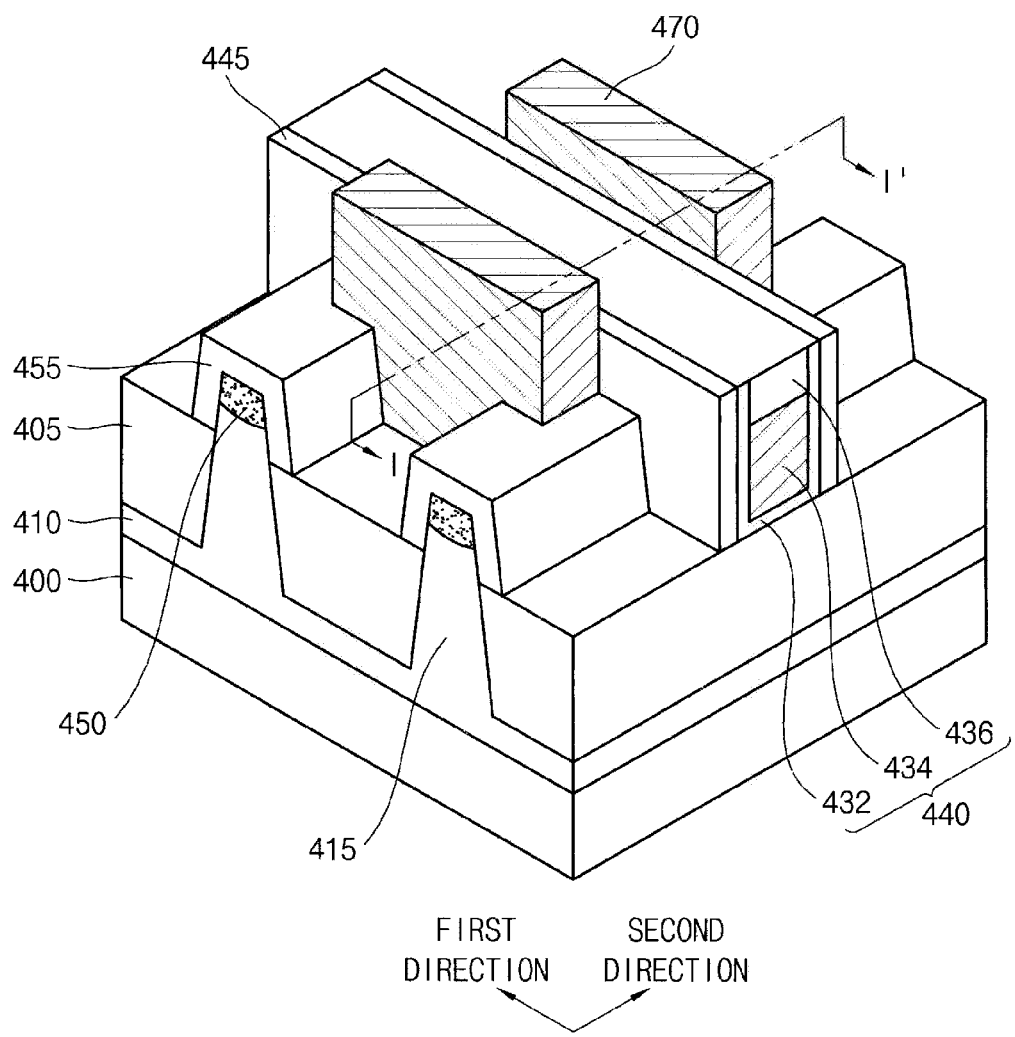
Figure 31:
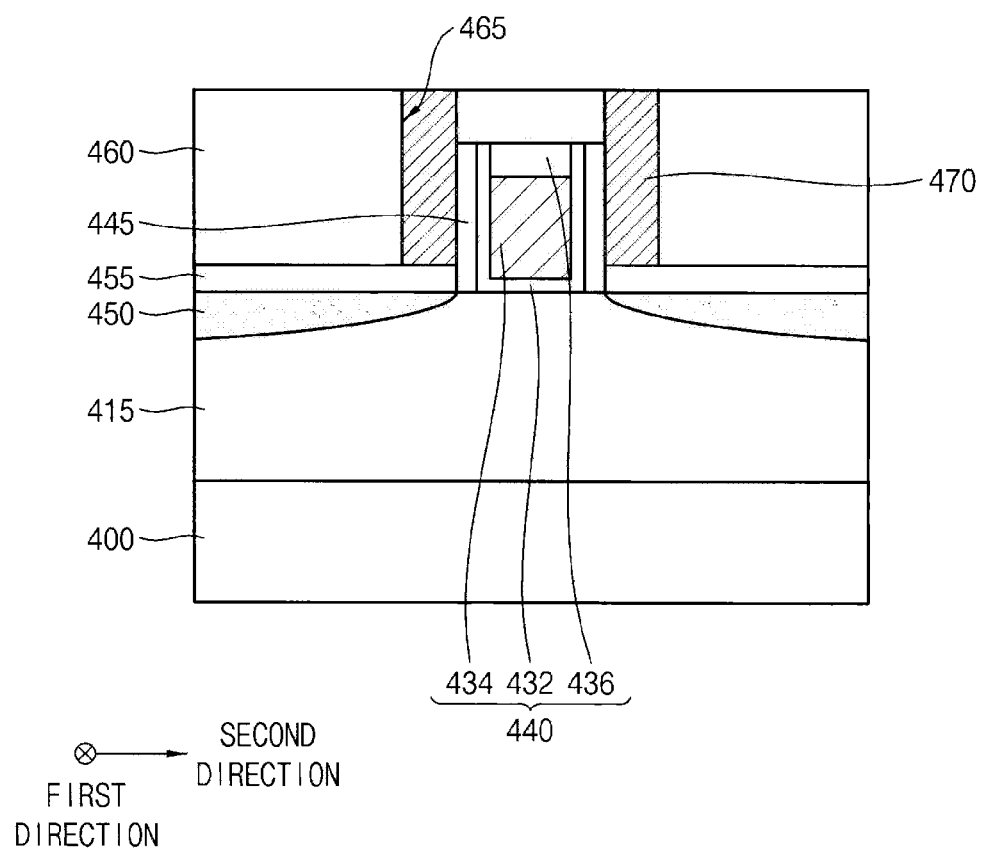

Referring to FIGS. 30 and 31, contacts 470, electrically connected to the second source/drain regions 455, may be formed. For example, a first lower insulation layer 460 covering the second source/drain region 455, the gate spacer 445 and the gate structure 440 may be formed on the isolation layer 405. For clarity of illustration, the lower insulation layer 460 is omitted from FIG. 30. The first lower insulation layer 460 may include a material such as silicon oxide, formed by a process such as a CVD process.

Once formed, the first lower insulation layer 460 may be partially etched to form contact holes 465, through which the second source/drain regions 455 may be at least partially exposed. In one embodiment, the contact holes 465 may be self-aligned with the gate spacer 445. A preliminary contact layer may then be formed to fill the contact holes (e.g., by an SEG process, using an exposed portion of the second source/drain region 455 through the contact holes 465 as a seed layer). Thereafter, the preliminary contact layer may be doped with impurities, (e.g., by an ion-implantation process) to form contacts 470 filling the contact holes 465 and electrically contacting the second source/drain region 455. In other embodiments, the preliminary contact layer may be formed by depositing a metal, a metal nitride, a metal silicide, polysilicon, amorphous silicon, or the like or any combination thereof, within the contact holes 465 (e.g., according to a process such as an ALD process, a PVD process, a CVD process, etc.).

In some embodiments, a plurality of the second source/drain regions 455 may be exposed through a common contact hole 465. For example, two second source/drain regions 455 neighboring one another in the first direction may be exposed through a common contact hole 465. In this case, as illustrated in FIG. 30, one contact 470 may electrically contact the two second source/drain regions 455. Accordingly, an alignment tolerance for the formation of the contact 470 may be increased.

In some embodiments, the width of the second source/drain region 455 (e.g., as measured along the second direction) may be expanded from the semiconductor fin 425 to serve as a pad for landing a contact 470. Accordingly, the alignment tolerance for formation of a contact 470 may be further increased.

Figure 32:
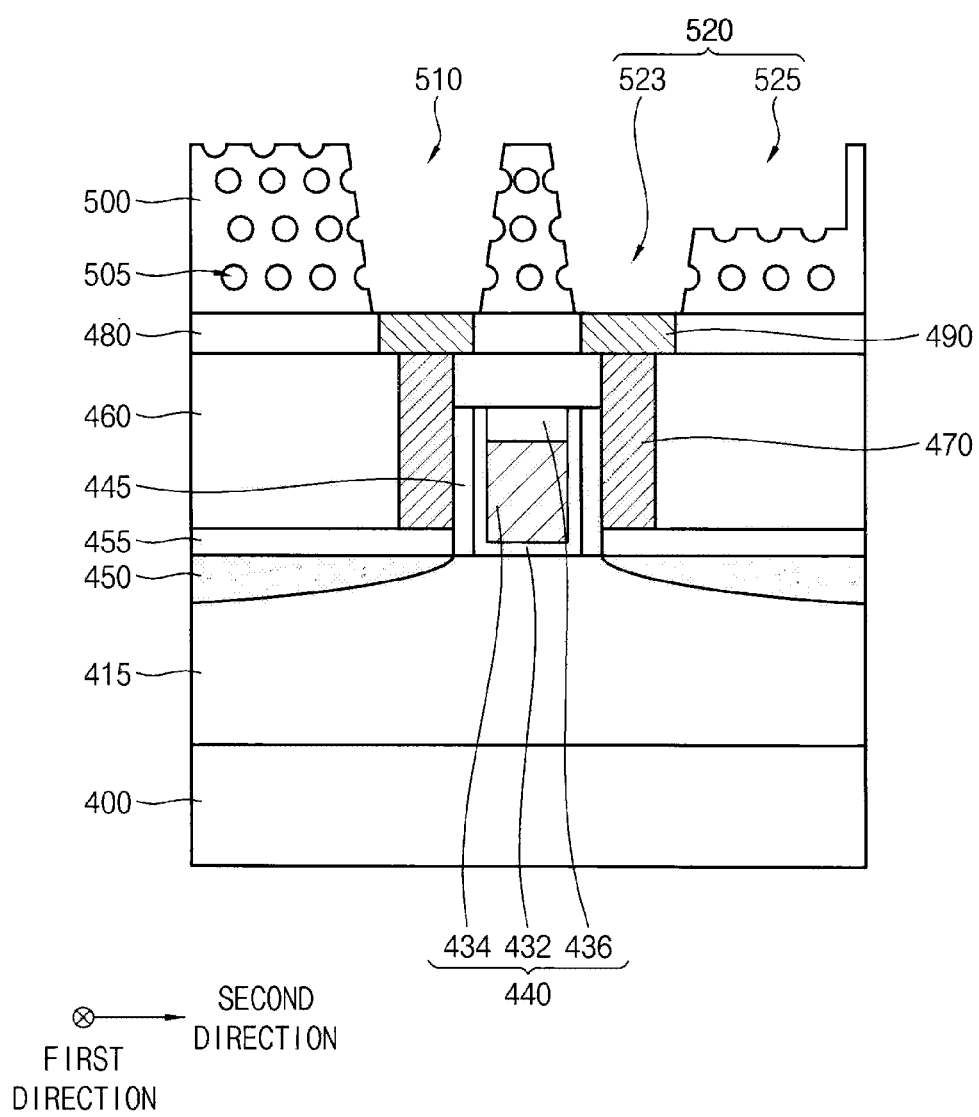

Referring to FIG. 32, a process substantially the same as or similar to that illustrated with reference to FIG. 3 may be performed so as to form a second lower insulation layer 480 and a lower wiring 490 on the first lower insulation layer 460 and the contact 470. Thereafter, an insulating interlayer 500 may be formed on the second lower insulation layer 480 and the lower wiring 490. After forming the insulating interlayer 500, a BEOL process (e.g., substantially the same as or similar to that described with reference to FIGS. 3 to 12, and/or FIGS. 13 to 22) may be performed.

For example, the insulating interlayer 500 may be partially removed to form a first opening 510 and a second opening 520, through which a top surface of the lower wiring 490 may be exposed. In the illustrated embodiment, the first opening 510 may have a via hole shape formed by a single damascene process (e.g., as discussed above with respect to FIG. 5) and the second opening 520 may have a via hole and trench shape formed by a dual damascene process (e.g., as discussed above with respect to FIGS. 14 and 15). Accordingly the second opening 520 may include a via hole 523, exposing the top surface of the lower wiring 490, and a trench 525 integrally formed with the via hole 523 and extending from an upper portion of the via hole 523. As exemplarily illustrated, pores 505 may be created within the insulating interlayer 500 and exposed at a surface of the insulating interlayer 500. The pores 505 may be created as a result of etching, ashing and/or stripping processes carried out in connection with the formation of the first and second openings 510 and 520, as a result of a modification treatment carried out before and/or after formation of the first and second openings 510 and 520, or the like or any combination thereof.

Figure 33:
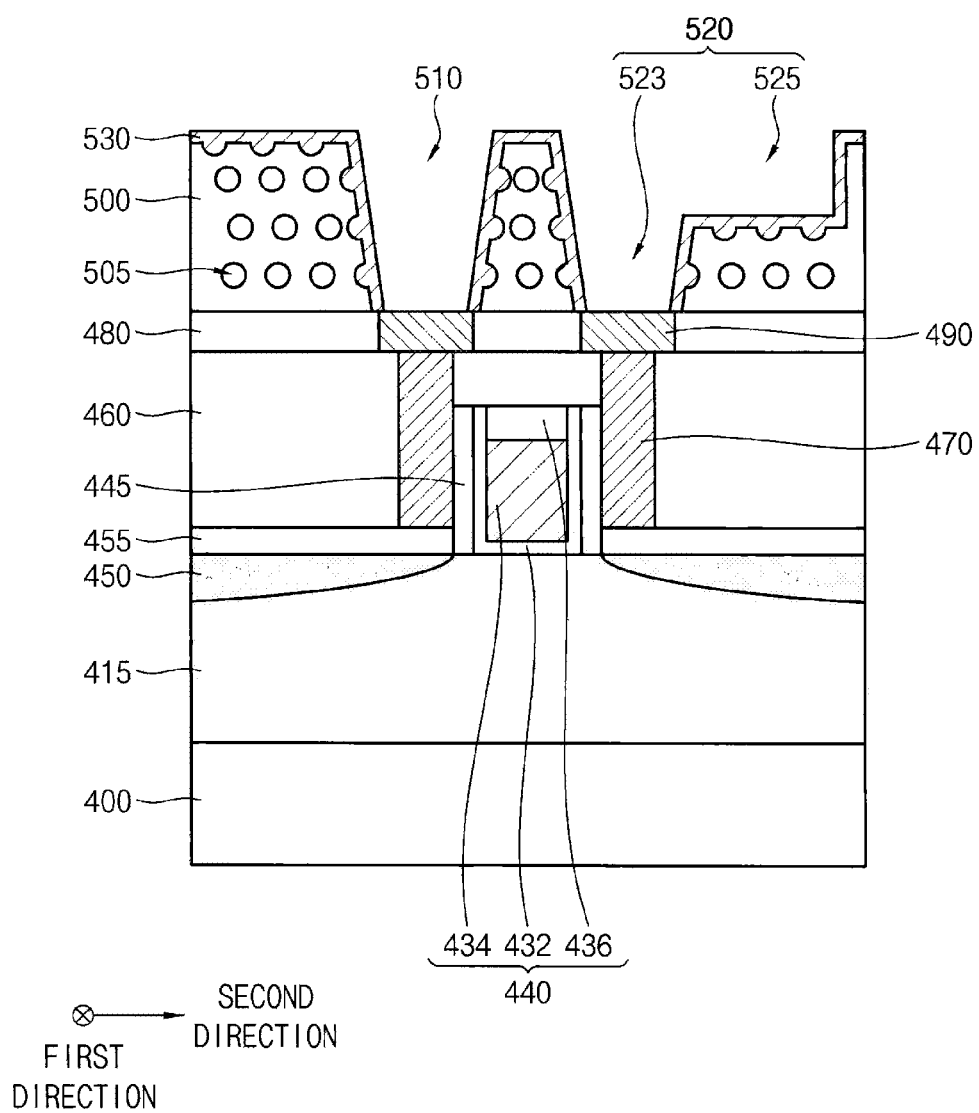

Referring to FIG. 33, a pore sealing layer 530, extending on the surface of the insulating interlayer 500 and sealing or capping the exposed pores 505, may be formed by exposing the insulating interlayer 500 to a silane component as exemplarily described above with reference to FIGS. 5 to 7 and FIG. 9. In some embodiments, the silane compound may be provided on the surface of the insulating interlayer 500 and inner walls of the first and second openings 510 and 520. While providing the silane compound, the insulating interlayer 500 may be exposed to UV irradiation, IR irradiation, a plasma treatment, etc., to facilitate a reaction between a reactive group included in the silane compound and an adsorption site (e.g., a hydroxyl group) exposed on the surface of the insulating interlayer 500.

As described above, the silane compound may be represented by the following General Formula.

$$(Re)a(Si)(R)b(Bu)c \qquad \text{[General Formula]}$$

Figure 34:
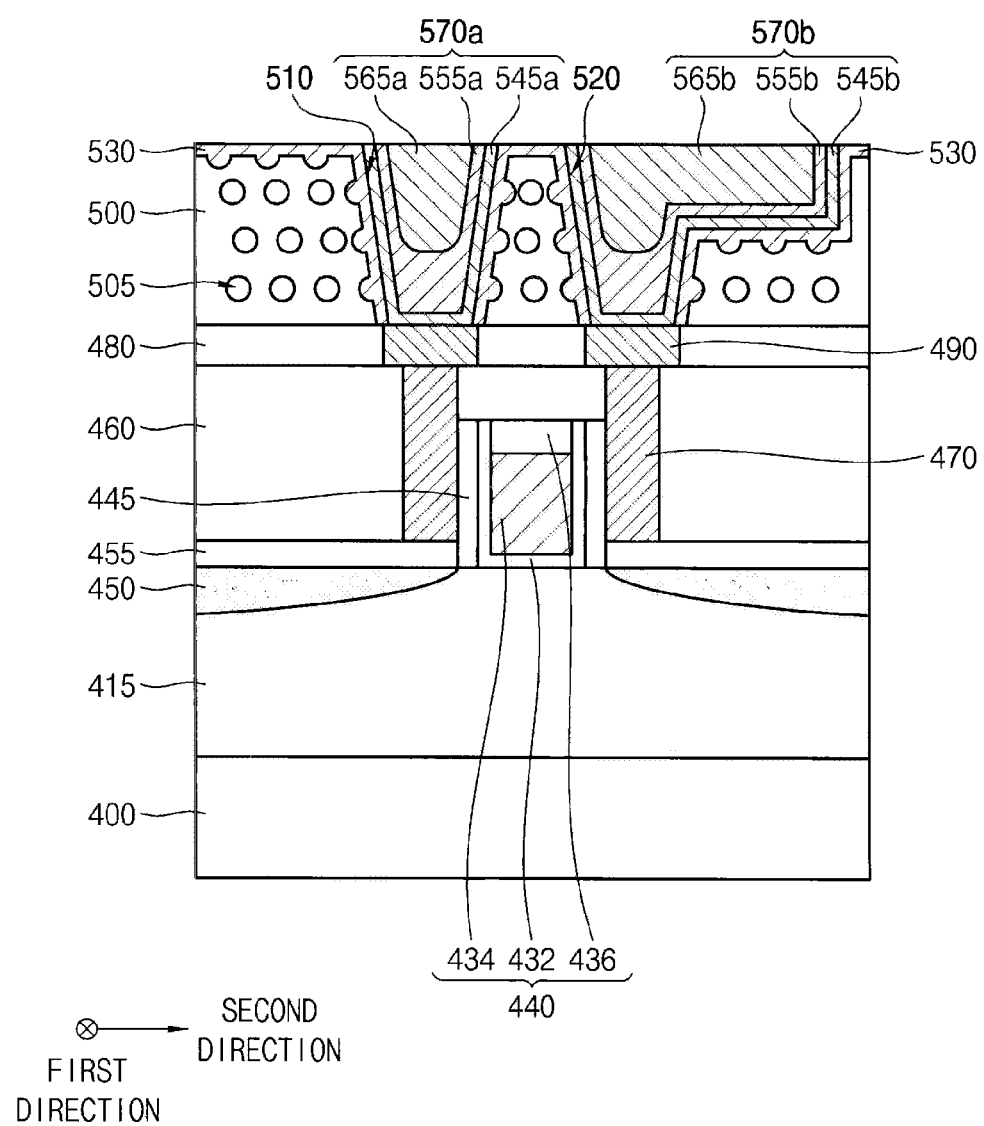

In some embodiments, the reactive group (Re) may include ammonia, an amino group, or the like. Examples of the amino group may include dimethyl amino ($-N(CH_3)_2$), methyl ethyl amino ($-N(CH_3)(CH_2CH_3)$) or diethyl amino ($-N(CH_2CH_3)_2$). In some embodiments, the alkyl group (R) may include an ethyl, a methyl, or the like. In some embodiments, the sealing group (Bu) may include a $C_4$-$C_{10}$ branched alkyl group such as tert-butyl, a $C_4$-$C_{10}$ unsaturated alkyl group, or the like. In some embodiments, the sealing group (Bu) may include a $C_4$-$C_6$ branched or unsaturated alkyl group. In some embodiments, the silane compound may include at least one compound selected from the group of compounds represented by the aforementioned Chemical Formulae (1) to (10). Provided as discussed above, the silane compound may be utilized to ensure that the pore sealing layer 240 has a substantially seamless profile while suppressing remaining hydroxyl groups and a side reaction. Referring to FIG. 34, processes substantially the same as or similar to those illustrated with reference to FIGS. 10 to 12, and/or FIGS. 18 and 19 may be performed to form a barrier layer, a seed layer and a metal layer on the pore sealing layer 530 and within the first and second openings 510 and 520. Thereafter, a first conductive pattern 570a and a second conductive pattern 570b in the first opening 510 and the second opening 520, respectively, may be created by, e.g., planarizing upper portions of the metal layer, the seed layer and the barrier layer.

As exemplarily illustrated, the first conductive pattern 570a may include a first barrier pattern 545a, a first seed pattern 555a and a first metal pattern 565a sequentially stacked from the inner wall of the first opening 510, and a sidewall of the first conductive pattern 570a may be surrounded by the pore sealing layer 530. Likewise, the second conductive pattern 570b may include a second barrier pattern 545b, a second seed pattern 555b and a second metal pattern 565b sequentially stacked from the inner wall of the second opening 520, and a sidewall and a bottom of the second conductive pattern 570b may be surrounded by the pore sealing layer 530.

According to example embodiments as described above, a BEOL wiring structure having a fine line-width, low-k property (e.g., due to the presence of the pores 505 within the interior of the insulating interlayer 500) and an improved electrical reliability (e.g., due to the formation of the pore sealing layer 530) may be formed in a FinFET device including the gate structure 440.

According to example embodiments discussed above, a silane compound may be provided on a sidewall of an opening formed in an insulating interlayer, as well as on other surfaces of the insulating interlayer, so that pores exposed at the sidewall and other surfaces may be sealed. The silane compound may include a reactive group, an alkyl group and a sealing group, each of which may be bonded to a silicon atom. The silane compound may be attached on the sidewall of the opening, or other on another surface, via the reactive group; and the pores may be sealed or capped by the sealing group. Further, a dielectric constant of the insulating interlayer may be reduced by the alkyl group. Therefore, when a wiring structure is formed on the insulating interlayer or within the opening, metal diffusion into the insulating interlayer may be prevented and the insulating interlayer have a low-k property.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a wiring structure, comprising:
   forming an insulating interlayer on a substrate, the insulating interlayer including an opening and pores distributed therein and exposed at a surface thereof;
   forming a pore sealing layer on the surface of the insulating interlayer and a sidewall of the opening by exposing the insulating interlayer to a silane compound represented by the formula: $(Re)a(Si)(R)b(Bu)c$,
   wherein Re, R and Bu represent a reactive group, an alkyl group and a sealing group, respectively, bonded to a silicon (Si) atom,
   wherein Re is an amino group, a halogen, a hydroxyl group or an alkoxy group, R is a $C_1$-$C_3$ alkyl group, and Bu is a $C_4$-$C_{10}$ branched alkyl group or a $C_4$-$C_{10}$ unsaturated alkyl group, and
   wherein each of a, b and c is 1 or 2, and a sum of a, b and c is 4; and forming a conductive pattern filling the opening on the pore sealing layer.

2. The method of claim 1, wherein the reactive group is the amino group.

3. The method of claim 2, wherein the reactive group is at least one selected from the group consisting of dimethyl amino (—N(CH$_3$)$_2$), methyl ethyl amino (—N(CH$_3$)(CH$_2$CH$_3$)) and diethyl amino (—N(CH$_2$CH$_3$)$_2$).

4. The method of claim 1, wherein the sealing group is a $C_4$-$C_6$ branched alkyl group or a $C_4$-$C_6$ unsaturated alkyl group.

5. The method of claim 4, wherein the sealing group is a tert-butyl group or a butenyl group.

6. The method of claim 1, wherein the alkyl group is a methyl or an ethyl.

7. The method of claim 1, wherein a is 1, b is 2, and c is 1.

8. The method of claim 1, wherein the pore sealing layer selectively caps pores exposed at the surface of the insulating interlayer relative to pores distributed within the insulating interlayer.

9. The method of claim 1, wherein the insulating interlayer includes a hydroxyl group exposed at the surface thereof, and
   wherein exposing the insulating interlayer to the silane compound includes reacting the hydroxyl group with the reactive group of the silane compound.

10. The method of claim 9, wherein reacting the hydroxyl group with the reactive group of the silane compound includes subjecting the insulating interlayer to at least one selected from the group consisting of an ultraviolet (UV) irradiation, an infrared (IR) irradiation and a plasma treatment.

11. The method of claim 1, wherein forming the conductive pattern includes forming a barrier layer in contact with the pore sealing layer.

12. The method of claim 11, wherein forming the conductive pattern further includes:
   forming a seed layer partially filling the opening on the barrier layer; and
   forming a metal layer filling a remaining portion of the opening on the seed layer by a plating process.

13. The method of claim 1, further comprising, before forming the insulating interlayer, forming a lower structure on the substrate, the lower structure including a lower wiring,
   wherein a top surface of the lower wiring is exposed through the opening.

14. The method of claim 1, wherein forming the insulating interlayer including the opening and pores comprises subjecting the insulating interlayer to a modification treatment to create the pores.

15. The method of claim 14, wherein the modification treatment includes at least one selected from the group consisting of a UV irradiation and a plasma treatment.

16. A method of forming a wiring structure, comprising:
   forming a lower structure including a lower wiring on a substrate;
   forming an insulating interlayer having pores on the lower structure;
   etching the insulating interlayer to form an opening through which the lower wiring is exposed;
   forming an intermediate layer capping the pores on a surface of the insulating interlayer and a sidewall of the opening by exposing the insulating interlayer to a silane compound represented by the formula: $(Re)(Si)(R)_2(Bu)$,
   wherein Re, R and Bu represent a reactive group, an alkyl group and a sealing group, respectively, bonded to a silicon (Si) atom, and
   wherein Re is an amino group, R is a $C_1$-$C_3$ alkyl group, and Bu is a $C_4$-$C_{10}$ branched alkyl group or a $C_4$-$C_{10}$ unsaturated alkyl group, and
   forming a conductive pattern filling the opening on the intermediate layer.

17. The method of claim 16, wherein the intermediate layer is not formed on a bottom of the opening.

18. The method of claim 17, wherein forming the conductive pattern includes forming a barrier layer in contact with the intermediate layer and a top surface of the lower wiring.

19. A method of manufacturing a semiconductor device, comprising:
   forming a plurality of semiconductor fins on a substrate;
   forming a gate structure extending on and crossing the semiconductor fins;
   forming source/drain regions at upper portions of the semiconductor fins adjacent to the gate structure;

forming a contact electrically connected to at least one of the source/drain regions; forming an insulating interlayer on the gate structure, the source/drain regions and the contact, the insulating interlayer including an opening therein;

forming an intermediate layer on a surface of the insulating interlayer and a sidewall of the opening by exposing the insulating interlayer to a silane compound represented by the formula: (Re)a(Si)(R)b(Bu)c, wherein Re, R and Bu represent a reactive group, an alkyl group and a sealing group, respectively, bonded to a silicon (Si) atom, wherein Re is an amino group, a halogen, a hydroxyl group or an alkoxy group, R is a $C_1$-$C_3$ alkyl group, Bu is a $C_4$-$C_{10}$ branched alkyl group or a $C_4$-$C_{10}$ unsaturated alkyl group, and wherein each of a, b and c is 1 or 2, and a sum of a, b and c is 4; and forming a conductive pattern on the intermediate layer and filling the opening.

20. The method of claim 19, wherein the silane compound includes at least one compound selected from the group consisting of the compounds represented by Chemical Formulae (1) to (10):

[Chemical Formulae]

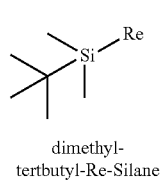

(1)

dimethyl-tertbutyl-Re-Silane

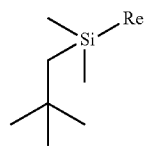

(2)

2-dimethylbutyl-dimethyl-Re-silane

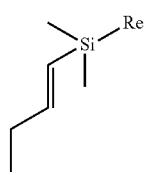

(3)

dimethyl-1-butene-Re-silane

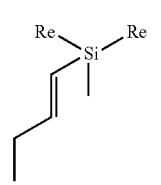

(4)

methyl-1-butene-bis(Re)-silane

-continued

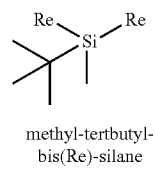

(5)

methyl-tertbutyl-bis(Re)-silane

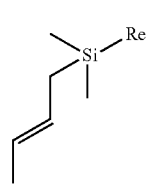

(6)

dimethyl-2-butene-Re-silane

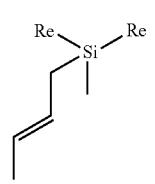

(7)

methyl-2-butene-bis(Re)-silane

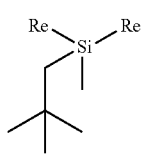

(8)

2-dimethylbutyl-methyl-bis(Re)-silane

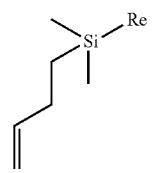

(9)

dimethyl-3-butene-Re-silane

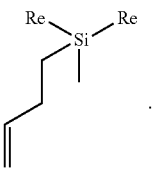

(10)

methyl-3-butene-bis(Re)-silane

* * * * *